United States Patent [19]
Tokunaga et al.

[11] Patent Number: 5,548,131
[45] Date of Patent: Aug. 20, 1996

[54] LIGHT-EMITTING DEVICE, OPTICAL RECORDING HEAD UTILIZING SAID DEVICE, AND OPTICAL PRINTER UTILIZING SAID OPTICAL RECORDING HEAD

[75] Inventors: Hiroyuki Tokunaga, Kawasaki; Hideshi Kawasaki, Yamato, both of Japan

[73] Assignee: Canon Kabushiki Kaisha, Tokyo, Japan

[21] Appl. No.: 309,961

[22] Filed: Sep. 12, 1994

Related U.S. Application Data

[63] Continuation of Ser. No. 885,613, May 19, 1992, abandoned.

[30]   Foreign Application Priority Data

May 23, 1991 [JP] Japan ................................ 3-146557
Dec. 11, 1991 [JP] Japan ................................ 3-327712

[51] Int. Cl.⁶ ............... H01L 29/04; H01L 31/0368; H01L 31/12
[52] U.S. Cl. ............................. 257/64; 257/81; 257/91; 257/448
[58] Field of Search ........................ 257/436, 448, 257/465, 81, 91, 95, 13, 79, 82, 84, 85, 53, 52, 64

[56] References Cited

U.S. PATENT DOCUMENTS

| | | | |
|---|---|---|---|
| 4,212,020 | 7/1980 | Yariv et al. | 257/95 |
| 4,916,503 | 4/1990 | Uematsu et al. | 257/436 |
| 5,243,200 | 9/1993 | Kawasaki et al. | 257/52 |
| 5,250,819 | 10/1993 | Kawasaki et al. | 257/91 |
| 5,369,290 | 11/1994 | Kawasaki et al. | 257/64 |

FOREIGN PATENT DOCUMENTS

| | | | |
|---|---|---|---|
| 57-88783 | 6/1982 | Japan | 257/95 |
| 61-87381 | 5/1986 | Japan | 257/82 |
| 2-297979 | 12/1990 | Japan | 257/91 |
| 4186780 | 7/1992 | Japan | 257/53 |
| 1542438 | 3/1979 | United Kingdom. | |

OTHER PUBLICATIONS

Sze, *Physics of Semiconductor Devices*, 2nd edition, 1981, pp. 700–702.

*Primary Examiner*—Sara W. Crane
*Assistant Examiner*—Alice W. Tang
*Attorney, Agent, or Firm*—Fitzpatrick, Cella, Harper & Scinto

[57]   ABSTRACT

A light-emitting device formed by applying a crystal formation process to a substrate with a free surface on which provided, in mutually adjacent manner, are a non-nucleation surface and a nucleation surface with a nucleation density larger than that of the non-nucleation surface, wherein the nucleation surface is provided in an oblong form.

14 Claims, 26 Drawing Sheets

LIGHT-EMITTING DEVICE, OPTICAL RECORDING HEAD UTILIZING SAID DEVICE, AND OPTICAL PRINTER UTILIZING SAID OPTICAL RECORDING HEAD

This application is a continuation of application Ser. No. 07/885,613 filed May 19, 1992 abandoned.

BACKGROUND OF THE INVENTION

1. Field of the Invention

The present invention relates to a light-emitting device, more particularly a light-emitting device utilizing a polycrystalline light-emitting diode of a III-V compound semiconductor, and a printer utilizing said semiconductor device.

2. Related Background Art

The conventional polycrystalline semiconductor materials have been applied in the following fields.

Among the polycrystalline semiconductor materials of the group IV of the periodic table, polycrystalline silicon has been principally used, for example, in solar cells and thin film transistors. Also among the polycrystalline compound semiconductors of the groups II-IV, those based on cadmium have been utilized in thin film transistors and photosensors, and are partly investigated for application to solar cells. Also those based on zinc have been utilized in fluorescent materials and piezoelectric devices. Also recently the polycrystalline materials of chalcopyrite family, such as $CuInSe_2$, are being investigated for application in solar cells.

Among the polycrystalline III-V compound semiconductor materials, those based on Ga or In were investigated for application in solar cells, but have not reached the level of commercialization.

In the field of the polycrystalline III-V semiconductor materials, various references are available on the application in solar cells, but the reports on the light-emitting characteristics are limited. Salerno et al. reported on the electron beam luminescence in Conf. RECIEEE, vol. 15, p. 1174–1178, but no report was made on the light-emitting diode characteristic utilizing a PN junction.

The display device utilizing light-emitting diodes (LED) is generally constructed by forming LED's on a monocrystalline wafer, cutting said LED's singly or in the unit of plural devices out of said wafer, and adhering such LED's on a supporting substrate, either in the form of an independent lamp or a display device for characters and symbols. Also as an LED display device of a large area, there have been produced devices containing plural LED's in a hybrid structure, but such large area devices are limited in application because of the high cost.

In order to overcome the limitation in the display area of such LED display devices, the present inventors proposed, in the Japanese Patent Laid-open Application No. 64-723, a selective nucleation method for producing a monocrystalline III-V compound semiconductor over a large area.

This method consists of utilizing a substrate having a non-nucleation surface with a low nucleation density for the III-V compound crystal and a nucleation surface of an amorphous material, which is positioned adjacent to said non-nucleation surface, has a sufficiently small area for allowing crystal growth only from a single nucleus and has a nucleation density higher than that of the non-nucleation surface, and growing the monocrystalline III-V compound crystal from said single nucleus extending beyond the nucleation surface and over the non-nucleation surface.

Also the present inventors proposed, in the Japanese Patent Laid-open Application No. 63-239988, an LED device utilizing this technology. Said proposal disclosed the formation of an LED on a non-monocrystalline substrate, by formation of a PN junction area through a change in the crystal forming conditions in the course of formation of said single crystal.

The polycrystalline substances produced by conventionally known methods have not been investigated for application to light-emitting devices such as LED, as they are not suitable for the preparation of such devices because of excessively small or uneven crystal grain sizes.

On the other hand, the above-mentioned selective nucleation method can provide a large-area III-V single crystal on a non-monocrystalline substrate, but there may sometimes appear polycrystals on the nucleation surface or a non-occupied state without crystals on the nucleation surface. Such substrate lacks uniformity when LED devices are formed thereon, as the light-emitting intensity becomes lower in the area of such polycrystals and becomes zero in the non-occupied areas.

Also the obtained single crystal sometimes shows strong anisotropy of growth, resulting in oblong abnormal growth, so that the device-making process such as electrode formation may become difficult.

Also the selective nucleation method has been associated with a contradicting drawback that a crystal growth condition enabling a high rate of single crystal formation results in a reduced occupancy rate, while a condition enabling a high occupancy rate results in a reduced rate of single crystal formation.

Because of the above-mentioned drawbacks, priority has often been given to the improvement on the production yield over a large area, with a certain sacrifice of luminance, unless a particularly high luminance is required for the devices.

Also as the crystal concentrically grown from the conventional nucleation surface has a limited tolerance for the mask alignment error in the device forming process after the crystal growth, and there has been longed for an improvement in the projection yield.

SUMMARY OF THE INVENTION

In consideration of the drawbacks in the prior art, the object of the present invention is to provide a light-emitting device capable of improving uniformity in the light-emitting area and in the luminance, and also improving the production yield at the device preparation.

The above-mentioned object can be attained, according to the present invention, by a light-emitting device formed by applying a crystal formation process to a substrate with a free surface including a non-nucleation surface and a nucleation surface, having a nucleation density larger than that of said nucleation surface, said surfaces being arranged in mutually adjacent manner, wherein said nucleation surface is provided in an oblong form.

More specifically, the light-emitting device of the present invention is featured, in the formation of III-V compound crystal, by employing a substrate with a free surface including, in mutually adjacent manner, a non-nucleation surface with a low nucleation density and a nucleation surface which has a nucleation density larger than that of said non-nucleation surface and is patterned to an optimum area for generating plural (2 to 50) nuclei at the crystal growth with an average grain size of 0.6 μm or larger, and applying a crystal forming process on said substrate thereby forming, from said nucleation surface, polycrystalline III-V compound with an average grain size of 0.6 μm or larger. Also it is featured by adding an etching material, such as HCl, at the crystal forming process, thereby controlling the grain size of the polycrystals at 0.6 μm or larger.

Also the present invention is featured by suitably adding doping materials at the formation of said III-V compound polycrystals, thereby forming an LED device with a PN junction.

Also the present invention is featured by suitably implanting doping materials after the formation of said III-V compound polycrystals, thereby forming an LED device with a PN junction.

Furthermore, the present invention is featured by forming said nucleation surface into a rectangular (or strip) shape, and constructing an LED structure by dividing the III-V compound polycrystals formed thereon by a plane perpendicular to the longer side of said rectangular nucleation surface and forming P- and N-electrodes respectively in thus divided areas, wherein the light is emitted in a direction parallel to said longer side.

DETAILED DESCRIPTION OF THE PREFERRED EMBODIMENTS

The III-V compound crystalline substance formed in the light-emitting device of the present invention is polycrystals grown, on a substrate, with a large grain size, and devices of uniform characteristics can be obtained over a large area because of a limited distribution of grain size. The light generated in a crystalline substance can be more efficiently taken out by forming the LED device by dividing a crystalline substance of an oval structure in the longitudinal direction thereof and effecting light emission in a direction parallel to said longitudinal direction. Also the device formation is facilitated because the steps for forming the LED device divided in the longitudinal direction of the crystalline substance of an oval structure have a large tolerance for the mask alignment error in the process.

Figure 46A:
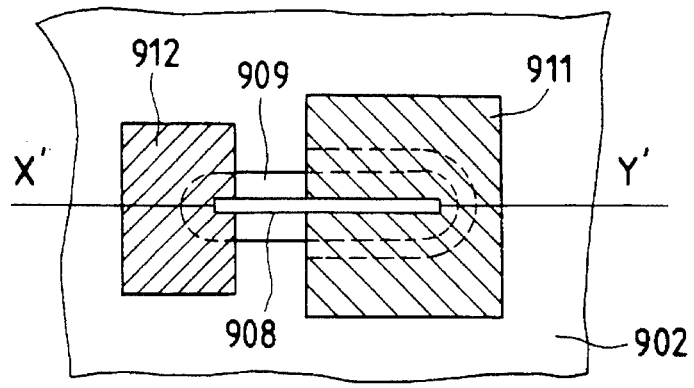
FIGS. 46A and 46B are respectively a plan view and a cross-sectional view of a device of the present invention.
Figure 46B:
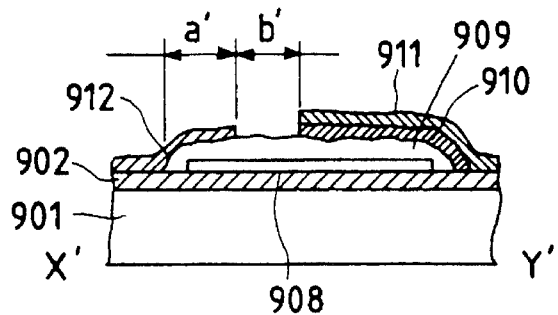
Figure 46C:
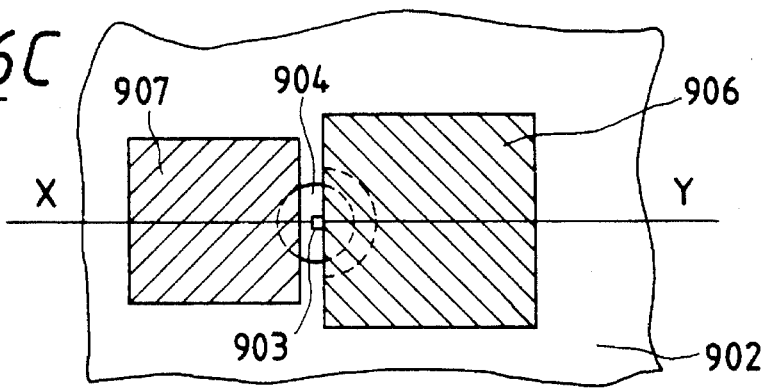
FIGS. 46C and 46D are respectively a plan view and a cross-sectional view of a conventional device.
Figure 46D:
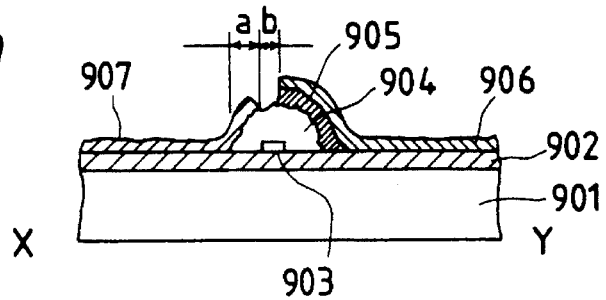

In the following, the features of the present invention will be explained, utilizing the accompanying drawings. FIGS. 46A and 46B are respectively a plan view and a cross-sectional view of a device of the present invention, while FIGS. 46C and 46D are similar views of a conventional device.

in either of the device of the present invention and the conventional device, on a substrate 901 and a non-nucleation surface 902, there are laminated in succession a nucleation surface 903 or 908, an N-semiconductor layer 904 or 909 and a P-semiconductor layer 905 or 910, and an N-electrode 907 or 912 is connected to the N-semiconductor layer 904 or 909 exposed by etching, while a P-electrode 906 or 911 is connected to the remaining part.

As the conventional structure employs a substantially square (or circular) nucleation surface 903, the internal semiconductor layer 904 (N type in this case) and the N-electrode 907 (N type in this case) have a small overlapping portion (area "a" in FIG. 46D), eventually leading to a disconnection of contact. Also the P-electrode 906 on the external semiconductor layer 905 (P type in this case) and the internal N-electrode 907 have a small shortest distance (portion "b" in FIG. 46D), eventually resulting in a short-circuiting. Also the contact areas of the electrodes are uneven and lead to a fluctuation in the electrical resistance, so that the light emission intensity may fluctuate from device to device.

In the present invention, there is employed a rectangular nucleation surface 908 for forming the semiconductor layers 909, 910 in oblong forms, which are divided by planes perpendicular to the longer sides thereof for forming the N-electrode 912 and the P-electrode 911. For this reason the overlapping portion (a'in FIG. 46B) of the internal semiconductor layer 909 and the electrode 912, and the shortest distance (b'in FIG. 46B) between the P-electrode 911 of the external semiconductor layer 910 (P type in this case) and the internal N-electrode 912 can both be made larger, and a sufficiently large overlapping area can be secured between the external semiconductor layer 910 and the electrode 911, so that the frequency of defects such as disconnected contact or shortcircuiting can be reduced in comparison with that in the conventional structure. Besides the fluctuation of the light emission intensity is reduced as the error in the contact areas of the electrodes is decreased.

In order to enlarge the overlapping areas in the conventional structure, for attaining an effect similar to that in the present invention, it becomes necessary to further grow the semiconductor layers 904, 905. Since these semiconductor layers grow in a semispherical form around the nucleation surface, the amount of deposition increases in proportion to the cube of the radius. Such growing operation is inefficient, as it requires an increased consumption of the raw materials and an extremely long growth time.

In the following there will be explained knowledge experimentally obtained by the present inventors on the physical properties of the III-V compound polycrystals related to the present'invention.

[Control method on crystal grain size]

At first investigation was made on the relationship between the size of the nucleation surface (square form) and the average grain size of polycrystals, in the selective deposition of GaAs polycrystals by a MOCVD method.

Following crystal growing conditions were employed for evaluation:

| | |
|---|---|
| TMG | $2.4 \times 10^{-5}$ mol/min. |
| AsH$_3$ | $1.4 \times 10^{-3}$ mol/min. |
| HCl (etching gas) | $2.2 \times 10^{-5}$ mol/min. |
| H$_2$ (carrier gas) | 10 l/min. |
| Substrate temp. | 775° C. |
| Pressure | 20 Torr |
| Growth time | 60 minutes |
| Nucleation surface | Polysilicon |
| Non-nucleation surface | SiO$_2$. |

Figure 47:
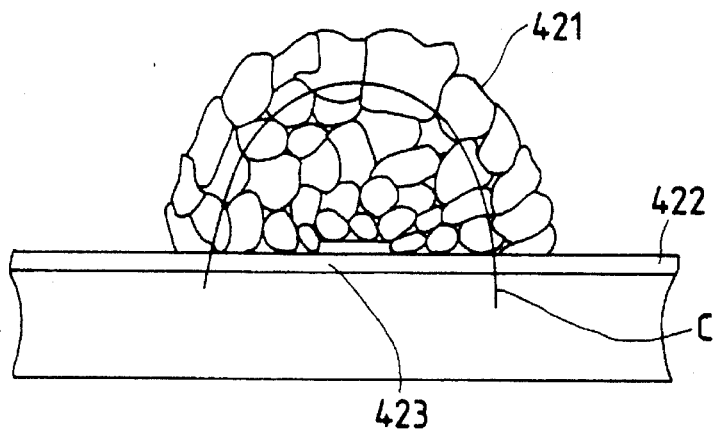
FIG. 47 is a view showing the method of evaluating the average grain size.

The average grain size was determined in the following manner. The GaAs polycrystals 421 selectively deposited, as shown in FIG. 47, in the form of an island around a polysilicon nucleation surface 423 on a SiO$_2$ non-nucleation surface 422 were surfacially protected with epoxy resin, then ground with diamond paste to a thickness of about 60 μm in a direction perpendicular to the substrate, further reduced in thickness to about 20 μm by ion milling, and was observed under a transmission electron microscope (TEM). In this observation, a semicircular curve C was drawn at a distance of about 2 μm from the surface of the crystals, and the average grain size was determined by dividing the length of said curve on the cross section with the number of grain boundaries crossing said curve plus one. (In this calculation, small particles grown in the gaps of the grains and smaller than 10 per cent of the largest grain size were disregarded.)

Example of calculation

Number of grain boundaries: 10

Length of curve in active area: 23 μm

Average grain size: 23/(10+1)=2.1 μm.

This TEM observation also proved that the grain size is somewhat smaller in a range of 2–3 μm from the nucleation surface, but becomes substantially uniform outside said range.

Figure 48:
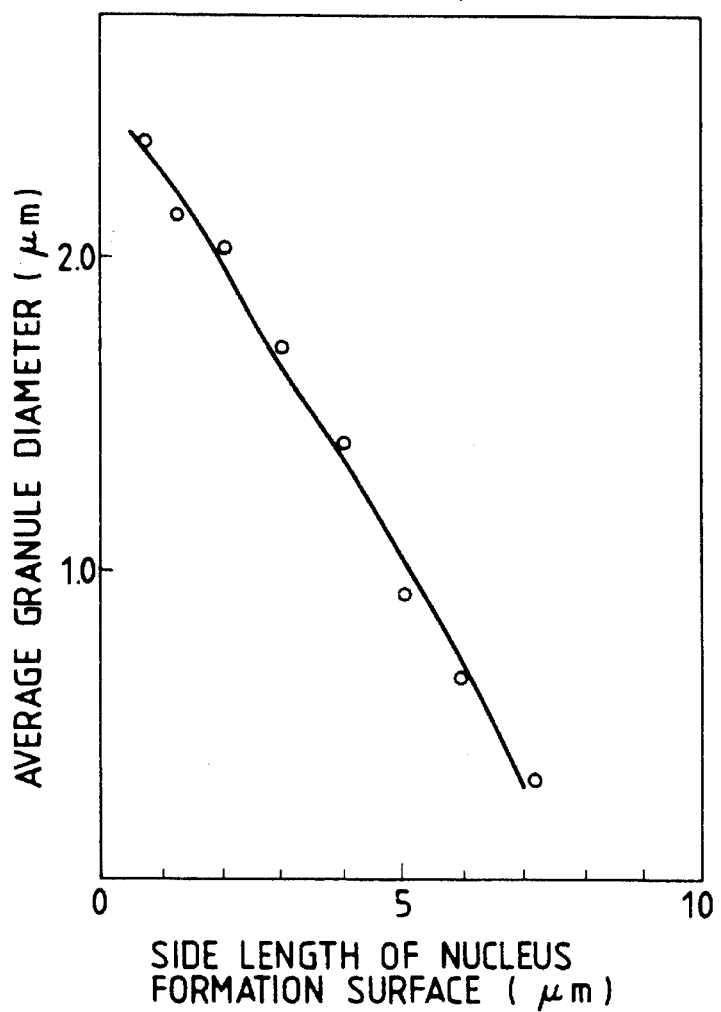
FIG. 48 is a chart showing the relationship between the size of nucleation surface and the average grain size of polycrystals, in the selective deposition method employed in the present invention.

FIG. 48 shows the relationship between the size of the nucleation surface and the average grain size. As will be apparent from this chart, the average crystal grain size becomes larger as the nucleation surface becomes smaller.

This phenomenon can be explained in the following manner. The nucleation density is determined by the material constituting the nucleation surface and the crystal growing conditions. With a relatively high density of arrangement of the nucleation surfaces, the number of nuclei decreases with a decrease in the area of the nucleation surface, and the grain size of each crystal increases since the raw material gas supply per unit volume and the total volume of crystals grown by said gas are constant.

Polysilicon, employed as the nucleation surface in this experiment and having a high nucleation density, has to be of a square of 0.5 μm or smaller, in order to generate a single crystal. On the other hand, with a nucleation surface of a material of a relatively low nucleation density, such as AlN, single crystal growth is possible from a square area of about 2 μm with suitable selection of the crystal growing conditions.

[Light emission characteristics]

Light emission characteristics were investigated on the LED device prepared with the GaAs polycrystals, of which grain size was controlled by the size of the nucleation surface as explained above.

Figure 49:
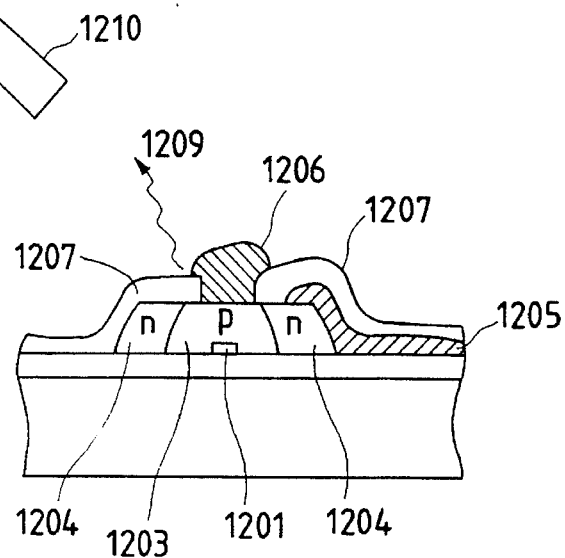
FIG. 49 is a cross-sectional view showing the structure of an LED device formed by selective deposition method.

FIG. 49 schematically shows the structure of thus prepared LED device. On a polysilicon nucleation surface 1201, P-GaAs polycrystals 1203 and N-GaAs polycrystals 1204 were grown in continuation and planarized, and an N-electrode 1205 (AuGeAu) and a P-electrode 1206 (Cr/Au) were formed across an insulation film 1207.

Crystal growing conditions

| | |
|---|---|
| TMG | $3.0 \times 10^{-5}$ mol/min. |
| AsH$_3$ | $2.0 \times 10^{-3}$ mol/min. |
| HCl (etching gas) | $2.2 \times 10^{-5}$ mol/min. |
| H$_2$ (carrier gas) | 10 l/min. |
| P-doping gas (DEZ) | $6.0 \times 10^{-5}$ mol/min. |
| N-doping gas (SiH$_4$) | $5.0 \times 10^{-7}$ mol/min. |
| Substrate temp. | 775° C. |
| Pressure | 20 Torr |
| Nucleation surface | polysilicon |
| Non-nucleation surface | SiO$_2$ |

The light intensity was compared by measuring the light 1209, generated from the junction, with a light power meter 1210. The GaAs polycrystalline LED's used for measurement showed light emission spectra with a peak in the infrared region, around 880 nm, regardless of the grain size.

Figure 50:
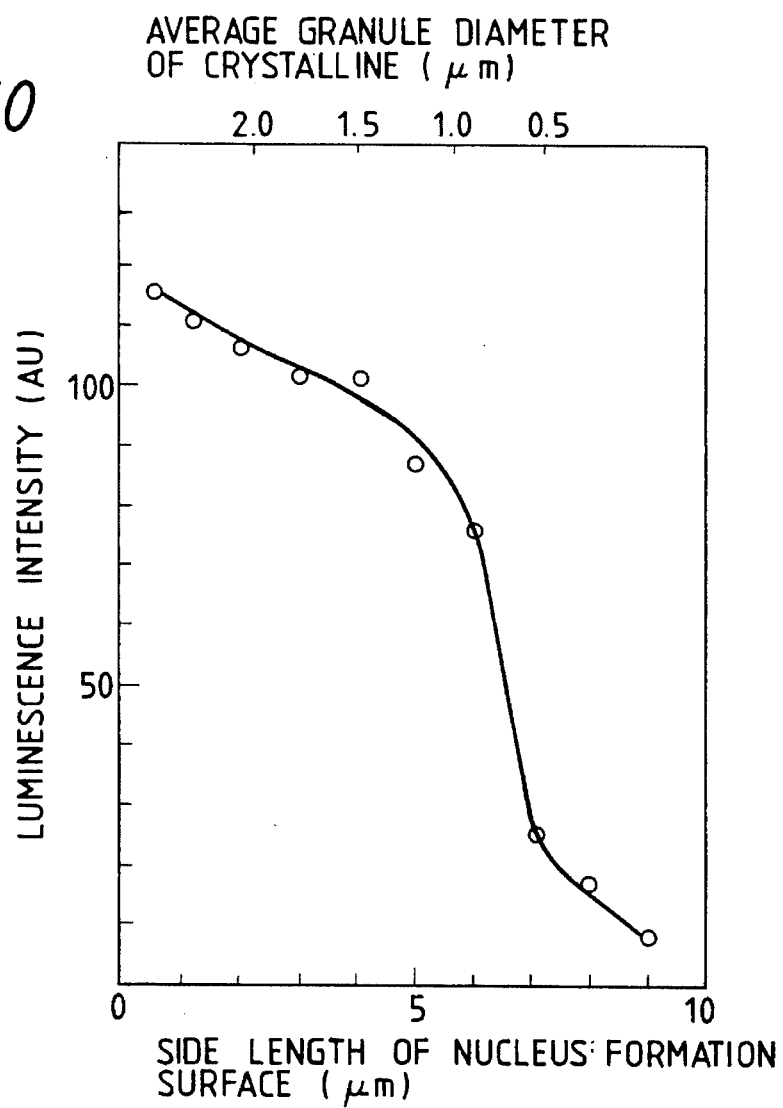
FIG. 50 is a chart showing the relationship between the size of nucleation surface and the light emission intensity in the LED device formed by the selective deposition method.

FIG. 50 shows the relationship between the size of nucleation surface (average crystal grain size) and the light emission intensity. The average crystal grain size is determined by observation at about 2 μm from the surface of the crystal island, because the crystallinity in this region most strongly affects the light emission intensity, as the PN junction is formed at 2–3 m from the surface in the LED preparation.

The light emission intensity of LED decreases with the increase in size of the nucleation surface (decrease in the crystal grain size). Said decrease in the light emission intensity is particularly marked in a range of variation of the nucleation surface from 5 to 6 μm (grain size change from 0.8 to 0.6 μm).

This is presumably ascribable to a fact that the crystal grain boundaries increase with the reduction in the grain size, and the recrystallization at such grain boundaries induces a loss in the light emission efficiency. Similar tendencies can be observed in the investigations on the carrier recombination rate or the diffusion length of minority carriers on polycrystalline GaAs by 0. Paz et al. (J. Appl. Phys. 61 (4) 15, 1987 p. 1537) and M. Yamaguchi et al. (J. Appl. Phys. 60 (1) 1, 1986 p. 413).

[Embodiments]

The III-V compounds of the present invention are not limited to those composed of two elements, but also cover III-V mixed crystal compounds involving three or more elements.

In the following there will be given a detailed explanation on an embodiment of the present invention, with reference to the attached drawings.

FIGS. 1A to 9B illustrate, cross-sectional views and plan views in pairs, the steps of preparation of an LED device provided with a nucleation surface of a stripe shape which is sufficiently longer in one side than in the other, according to the method of the present invention and employing an MOCVD apparatus.

[1st step]

Figure 1A:
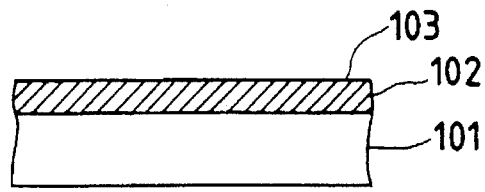
FIGS. 1A and 1B are respectively a cross-sectional view and a plan view, showing the state of deposition on the non-nucleation surface in an embodiment of the present invention.
Figure 1B:
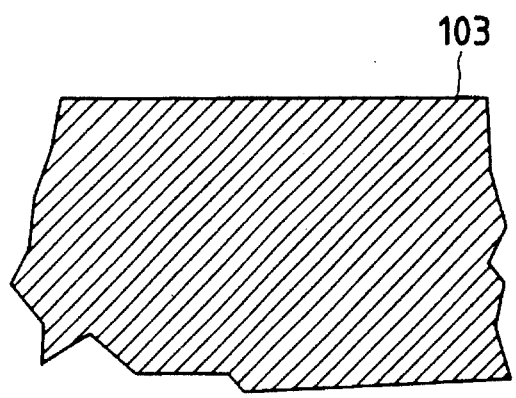

On a substrate 101 (composed for example of a ceramic material such as $Al_2O_3$, AlN or BN; carbon; polysilicon; quartz; high-melting glass; or a high-melting metal such as W, Mo or Ti), there is deposited, as shown in FIGS. 1A and 1B, a thin film 102 of a material of a low nucleation density (for example amorphous $SiO_2$ or $Si_3N_4$), and the upper face of said thin film constitutes a non-nucleation surface 103.

Figure 11:
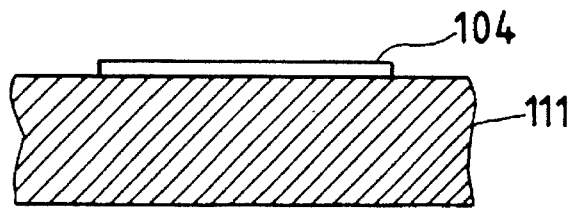
FIG. 11 is a cross-sectional view of a substrate serving also as the non-nucleation surface.

Said thin film 102 may be formed by CVD, sputtering, vacuum evaporation, or coating with a dispersion medium. Also the substrate 101 may be replaced, as shown in FIG. 11, by a substrate 111 composed of a material of a low nucleation density.

[2nd step]

Figure 2A:
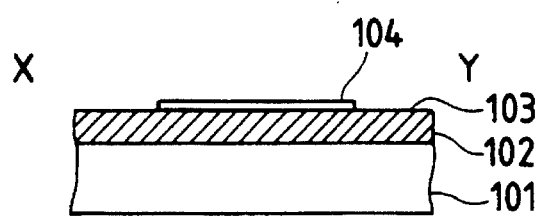
FIGS. 2A and 2B are respectively a cross-sectional view and a plan view, showing the state of formation of the nucleation surface in an embodiment of the present invention.
Figure 2B:
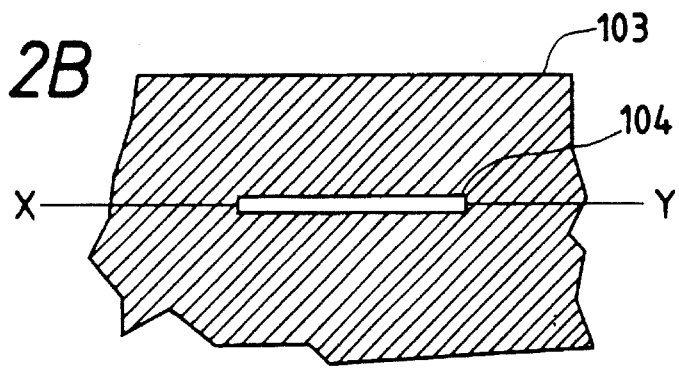

As shown in FIGS. 2A and 2B, a material (for example non-monocrystalline polysilicon, amorphous silicon, AlN, $Al_2O_3$, $Ta_2O_5$, TiN, $TiO_2$ or $WO_3$) with a nucleation density higher than that of the non-cleation surface 103 is formed in a fine stripe shape (with a width of 1–8 μm, preferably 1–6 μm and most preferably 1–3 μm) to constitute a nucleation surface 104. The longer side of the stripe needs only to be longer than the shorter side, but, for enhancing the effect of the present invention, the size of the longer side is generally 8 μm or longer, preferably 15 μm or longer and most preferably 20 μm or longer. The oblong form of the nucleation surface 104 is not limited to a rectangle but can also be oval or other form, and may also be a bent form instead of straight form.

Figure 12:
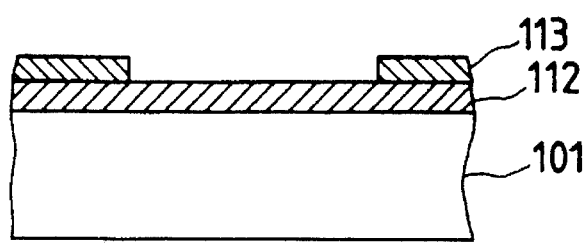
FIG. 12 is a cross-sectional view showing an example of arrangement of the nucleation surface and the non-nucleation surface.
Figure 13:
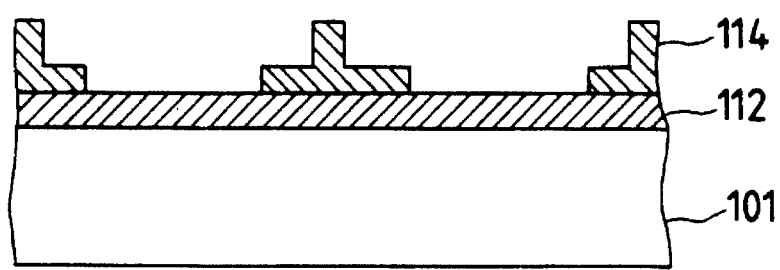
FIG. 13 is a cross-sectional view showing another example of arrangement of the nucleation surface and the non-nucleation surface.

In addition to the patterning of the thin film into a thin stripe form, it is also possible, as shown in FIG. 12, to deposit a thin film 112 of a material of a high nucleation density on a substrate, then to deposit thereon a thin film of a material of a low nucleation density to constitute the non-nucleation surface 113, and to form a narrow window by etching to expose said thin film 112 constituting the nucleation surface. It is also possible, as shown in FIG. 13, to deposit a thin film 114 of a material of a low nucleation density, to form a recess in said thin film, and to open a narrow window in the bottom of said recess thereby exposing the thin film 112 constituting the nucleation surface. In this case the crystals are grown in said recess.

Figure 14:
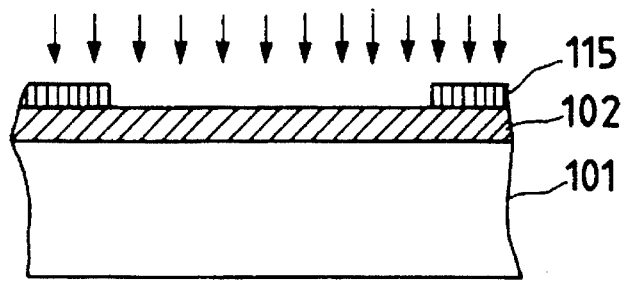
FIG. 14 is a cross-sectional view showing the state of ion implantation into the non-nucleation surface in an embodiment of the present invention.
Figure 15:
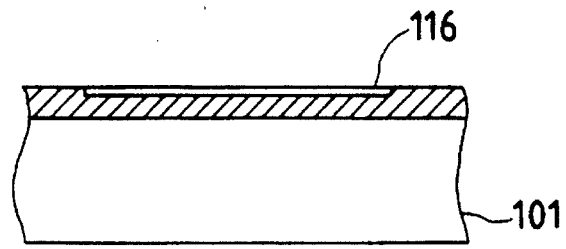
FIG. 15 is a cross-sectional view showing a nucleation surface formed by ion implantation in an embodiment of the present invention.

FIGS. 14 and 15 illustrate still another method, which consists of covering the upper face of a thin film 102 of a material of a low nucleation density with a photoresist layer 115, leaving a small area therein, and implaning ions for example of As, Ti, Ga, Al, In or Si into said thin film 102 as indicated by arrows in FIG. 14, thereby forming an area 116 of a high nucleation density as shown in FIG. 15.

The mutual distance of the nucleation surfaces 104 separated in this step is generally in a range of 20–200 μm, preferably 30–150 μm and most preferably 40–100 μm.

[3rd step]

Figure 3A:
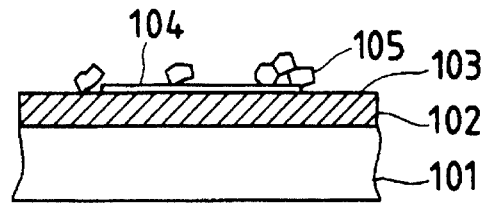
FIGS. 3A and 3B are respectively a cross-sectional view and a plan view, showing the state crystal nuclei generation in an embodiment of the present invention.
Figure 3B:
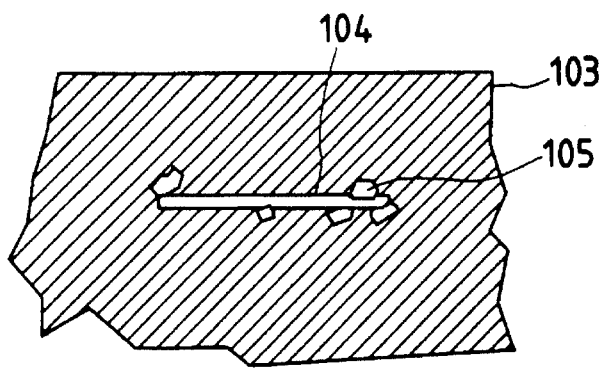

As shown in FIGS. 3A and 3B, on the processed substrate, there are grown nuclei 105 of a III-V compound (for example GaAs, GaAlAs, GaP, GaAsP, InP, GaInAsP etc.) by the MOCVD method.

As the raw material for said III-V compound semiconductor, there is employed, for example, TMG (trimethyl gallium), TEM (triethyl gallium), TMA (trimethyl aluminum), TEA (triethyl aluminum), DAH (diethyl aluminum hydride), TMI (trimethyl indium), TEI (triethyl indium), TBAs (tertiary-butyl arsine), TMAs (trimethyl arsine), TEAs (triehtyl arsine), DMAs (dimethyl arsine), DEAs (diethyl arsine), $AsH_3$ (arsine), TBP (tertiary-butyl phosphine), TEP (triethyl phosphine), $PH_3$ (phosphine), or $NH_3$. Also as the doping material, there is employed, for example, DMSe (dimethyl selenium), DESe (diethyl selenium), DMTe (dimethyl tellurium), DETe (diethyl tellurium), $SiH_4$ (silane), DMZ (dimethyl zinc), DEZ (diethyl zinc), $Cp_2Mg$ (cyclopentane magnesium), or $(MeCp)_2Mg$ (methylcyclopentane magnesium).

In this operation, the substrate temperature is generally maintained within a range of 570° C.–850° C., preferably 600° C.–800° C., and most preferably 660° C.–780° C., and the reaction pressure is generally within a range of 100 Torr or lower, preferably 50 Torr or lower, and most preferably 4 to 30 Torr. The moler ratio of the raw materials for the elements of groups V/III is generally in a range of 10–150, preferably 30–80, and most preferably 40–70.

HCl is introduced as the etching gas, with a flow rate, to the total gas flow rate, within a range of $7 \times 10^{-4}$ to $6 \times 10^{-3}$ mol. %, preferably 1 to $5 \times 10^{-3}$ mol. %, and most preferably 2 to $3 \times 10^{-3}$ mol. %.

[4th step]

Figure 4A:
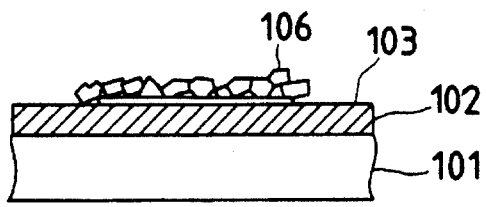
FIGS. 4A and 4B are respectively a cross-sectional view and a plan view, showing the state of growth of a polycrystalline layer, in an embodiment of the present invention.
Figure 4B:
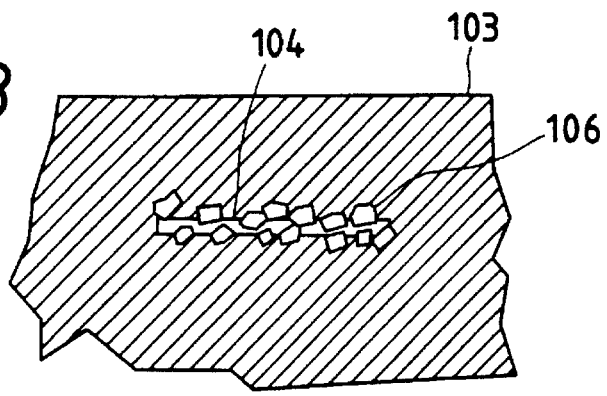

Nuclei 105 grow in time and new nucleations also take place, whereby, as shown in FIGS. 4A and 4B, the nucleation surface 104 is covered by a polycrystalline layer 106 consisting of thus grown nuclei 105. The crystal growth then continues in such a manner that the polycrystalline layer 106 expands over the non-nucleation surface 103. At this point the doping gas is added so as to attain a carrier concentration of N or P type of about $10^{18}$ cm$^{-3}$.

[5th step]

Figure 5A:
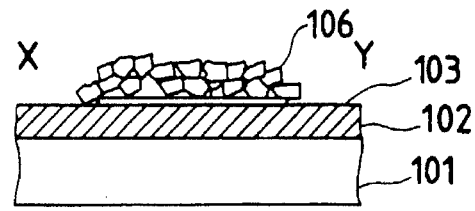
FIGS. 5A, 5C and 5B are respectively cross-sectional views and a plan view, showing the state of formation of an N- or P-polycrystalline layer in an embodiment of the present invention.
Figure 5B:
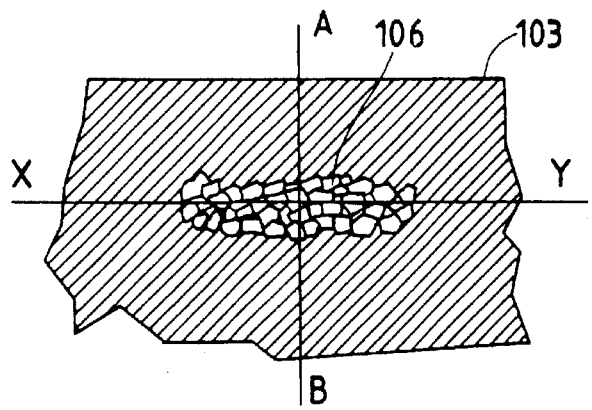
Figure 5C:
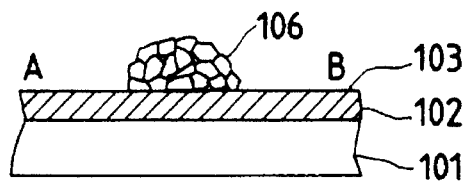

As shown in FIGS. 5A and 5B, the polycrystalline layer 106 of N or P type is grown to a desired size. Said layer 106 grows semicircularly around the nucleation surface 104, in a cross section along a line A-B, shown in FIG. 5C.

[6th step]

Figure 6A:
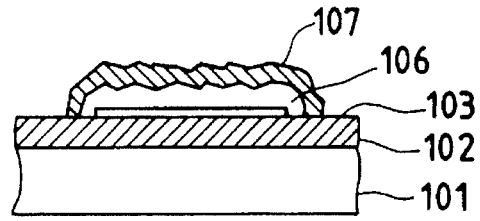
FIGS. 6A and 6B are respectively a cross-sectional view and a plan view, showing the state of formation of a P- or N-polycrystalline layer in an embodiment of the present invention.
Figure 6B:
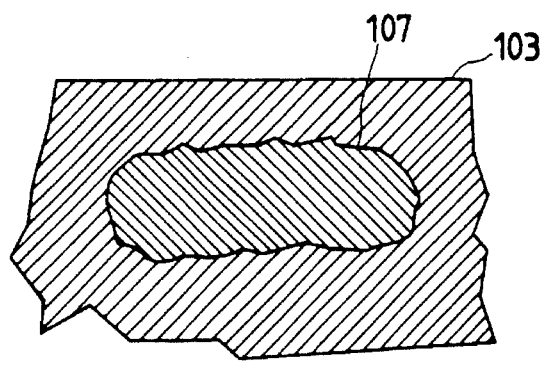

Then the doping gas is switched to grow, on the above-mentioned N- or P-polycrystalline layer 106, a polycrystalline layer 107 of opposite P- or N-type, concentrically around the nucleation surface 104, with a desired size as shown in FIGS. 6A and 6B. The external diameter of said polycrystalline layers 106, 107 constituting a polycrystalline III-V compound semiconductor island, in the cross section A-B (cf. FIG. 5C) is generally in a range of 5–120 μm, preferably 10–80 μm, and most preferably 15–60 μm.

[7th step]

Figure 7A:
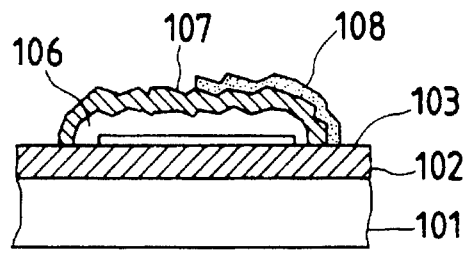
FIGS. 7A and 7B are respectively a cross-sectional view and a plan view, showing the state electrode formation in an embodiment of the present invention.
Figure 7B:
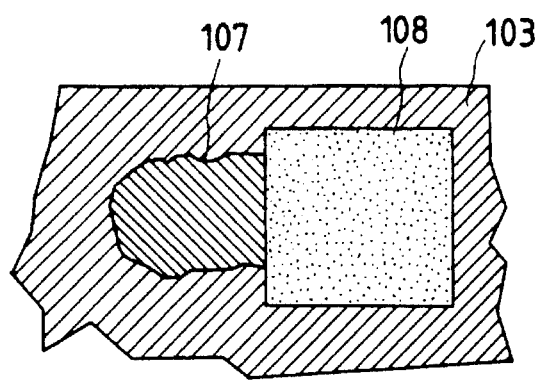

On thus grown polycrystalline island, there is formed, as shown in FIGS. 7A and 7B, a metal electrode 108 in ohmic contact with the external polycrystalline layer 107 by photolithographic patterning.

[8th step]

Figure 8A:
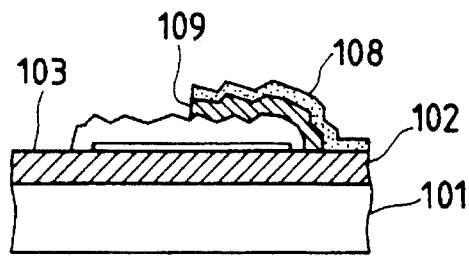
FIGS. 8A and 8B are respectively a cross-sectional view and a plan view, showing the state of etching of the polycrystalline layer in an embodiment of the present invention.
Figure 8B:
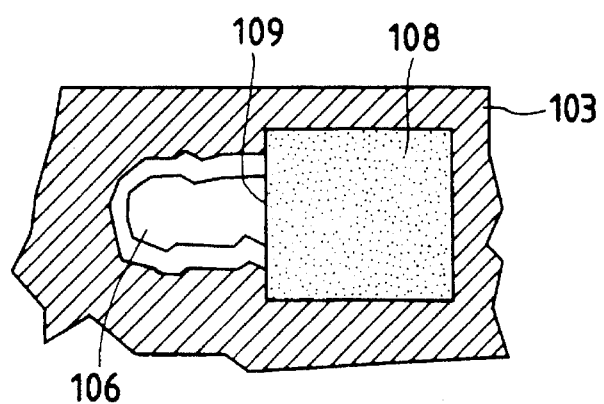

As shown in FIGS. 8A and 8B, the polycrystalline island is photolithographically etched, excluding the part covered by the metal electrode 108, to expose the internal polycrystalline layer 106. A section 109 formed in the external polycrystalline layer 107 constitutes a light-emitting area of the LED.

[9th step]

Figure 9A:
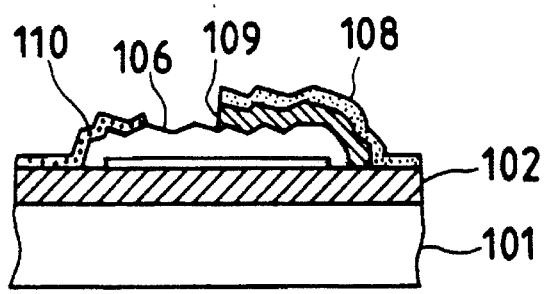
FIGS. 9A and 9B are respectively a cross-sectional view and a plan view, showing the state of electrode formation in an embodiment of the present invention.
Figure 9B:
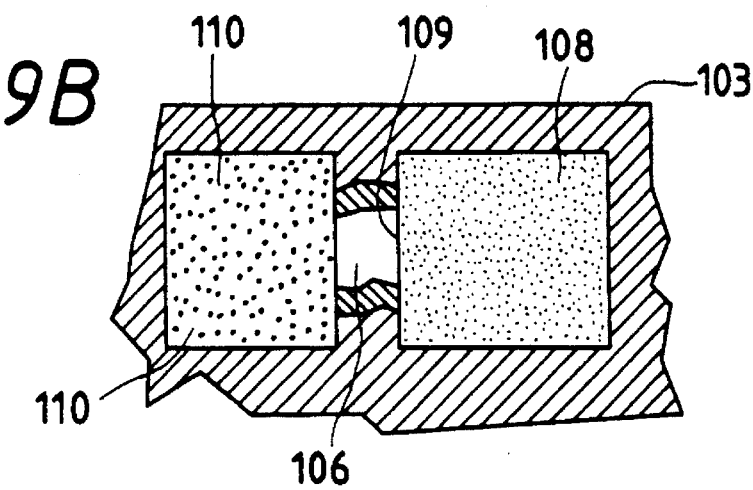

Then, as shown in FIGS. 9A and 9B, a metal electrode 110 in ohmic contact with the internal polycrystalline layer 106 is formed by photolithographic patterning. Subsequently, the resistances of the metal electrode 108, 110 are optimized by annealing, in inert gas such as argon, at a predetermined temperature, generally in a range of 300° C.–600° C., preferably 400° C.–500° C., most preferably 450° C.–500° C.

A voltage application between the metal electrodes 108, 110 induces charge injection between the polycrystalline layers 106 and 107, whereby said layers function as a light-emitting diode.

Figure 10:
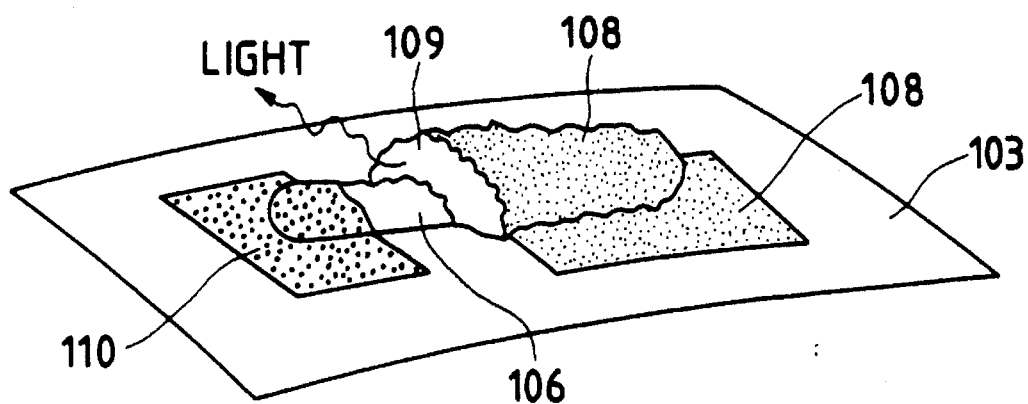
FIG. 10 is a perspective view of an LED device of the present invention.

FIG. 10 is a perspective view of the LED device produced through the above-mentioned steps.

If the substrate 101 is made of a translucent material such as $SiO_2$, the light can be taken out from the lower part of the device, through said substrate 101. Also the light may be taken out from the upper part of the device, by suitably forming the metal electrodes 108, 110.

Figure 16:
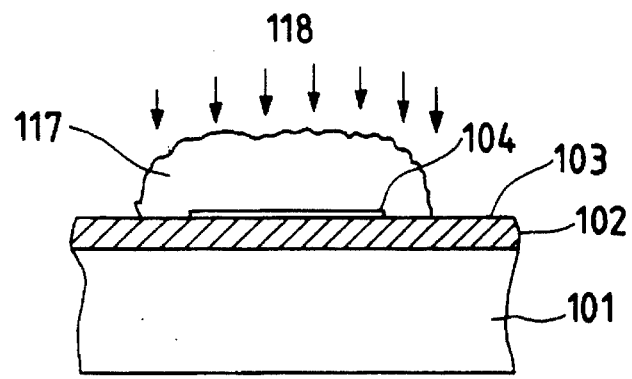
FIG. 16 is a cross-sectional view showing the state of ion implantation into a polycrystalline layer in an embodiment of the present invention.
Figure 17:
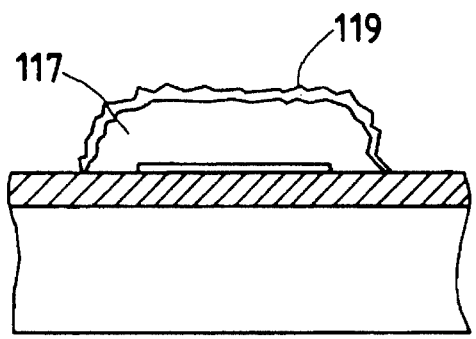
FIG. 17 is a cross-sectional view showing the state of a polycrystalline later immediately after ion implantation in an embodiment of the present invention.
Figure 18:
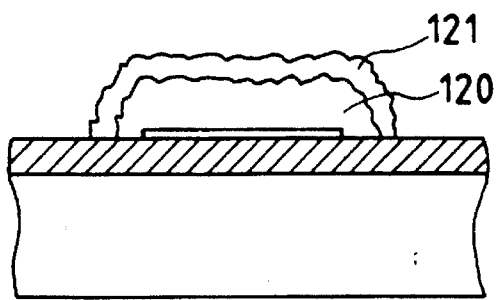
FIG. 18 is a cross-sectional view showing the state of a polycrystalline layer in which a PN junction is formed by ion diffusion, in an embodiment of the present invention.

Various modifications are possible in the structure and in the forming method of the device. The PN junction may be formed, in addition to the switching of doping gas in the course of crystal growth as explained above, as shown in FIGS. 16 to 18 by forming a polycrystalline layer 117 of P- or N-type, implanting dopant ions 118 into said layer 117 by means of an ion implanter to form an ion implanted area 119 of an opposite conductive type, and effecting thermal diffusion to form polycrystalline layers 120, 121 of mutually different conductive types.

Figure 19:
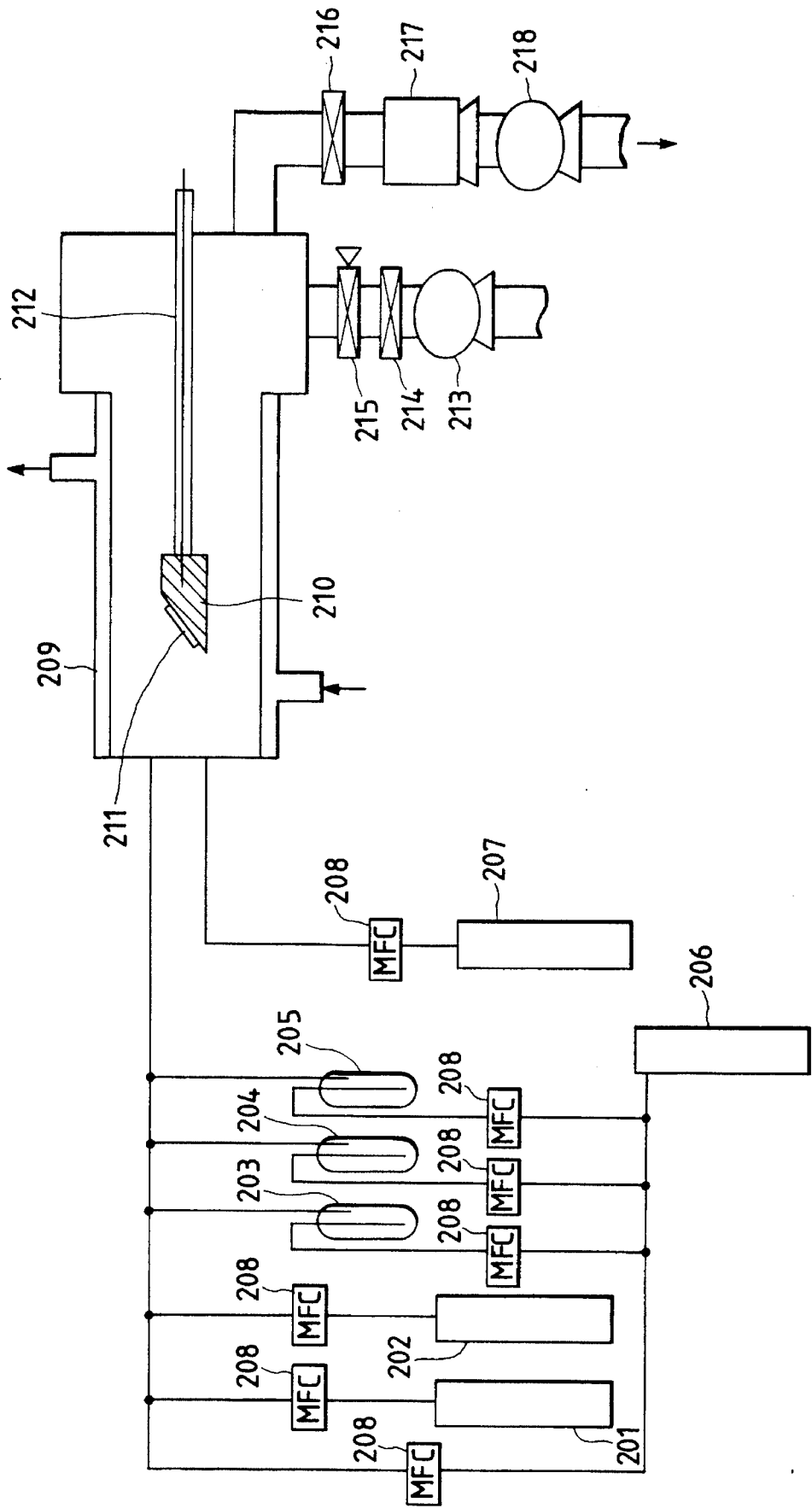
FIG. 19 is a schematic view of an MOCVD apparatus employed in the method of the present invention.

FIG. 19 is a schematic view of an MOCVD apparatus employed for executing the above-mentioned steps. The illustrated apparatus is of low-pressure horizontal type, but there may also be employed the apparatus of vertical type, in which the substrate is supported vertically, or of other types. A reactor 209 with a jacket for water cooling is made of quartz, and the interior thereof is evacuated to about $10^{-6}$ Torr by means of a turbo molecular pump 217, except at the crystal growth. A substrate holder 210, for supporting the substrate 211, is made of carbon, and can be heated to 900° C. by a high frequency coil (not shown) provided outside the reactor 209. The temperature of said substrate 211 is measured by a thermocouple 212 provided in the holder 210, and is fed back through a signal processing circuit to said high frequency coil, whereby precise temperature control is rendered possible. The raw material gas is introduced into the reactor 2091 from the left hand end thereof shown in FIG. 19. Liquid material such as trimethyl gallium (TMG) or trimethyl alluminum (TMA), and liquid dopant such as diethyl zinc (DEZ) is contained in stainless steel bubblers 203–205 and maintained at predetermined temperatures by thermostat tanks (not shown).

These liquid raw materials and liquid dopants are vaporized by bubbling with hydrogen gas 206 controlled by a mass flow controller (MFC) 208, and are transported to the reactor 209.

Gaseous materials such as arsine or phosphine, and gaseous dopants such as silane or selenium hydride are contained in containers 201, 202 and directly supplied to the reactor 209 through a mass flow controller. HCl 207, employed as etching gas, is introduced into the reactor 209 through a separate piping.

The gasses introduced into the reactor 209 pass by the substrate 211 and are discharged by a rotary pump 213. In this state, the aforementioned turbo moleculer pump 217 is detached from the system by a valve 216, and the reaction pressure is controlled by a variable conductance valve 215.

In the following, the present invention will be further clarified by examples thereof.

EXAMPLE 1

Figure 20A:
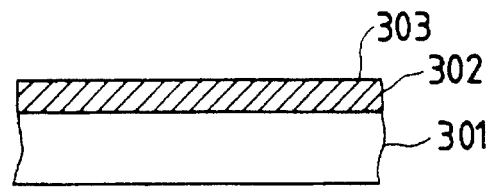
FIGS. 20A and 20B are respectively a cross-sectional view and a plan view showing the state of formation of the non-nucleation surface in a first embodiment of the present invention.
Figure 20B:
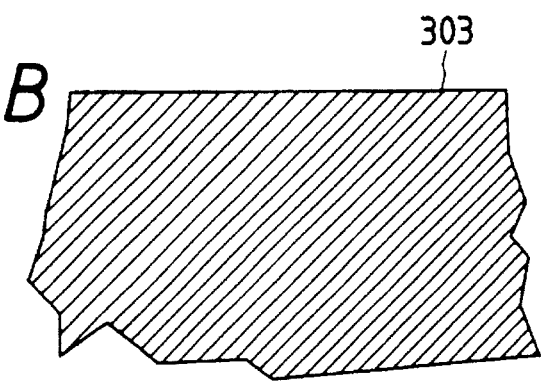

FIGS. 20A to 28B illustrate, cross-sectional views and plan views in pairs, the steps of an LED device employing polycrystalline GaAlAs of the present invention.
(1st step)
On an alumina substrate 301 of a thickness of 1 mm, there was deposited, as shown in FIGS. 20A and 20B, a $SiO_2$ film 302 of a thickness of 1500 Å by CVD employing $SiH_4$ and $O_2$. The upper face of said $SiO_2$ film 302 formed the non-nucleation surface 303. The deposition was conducted with $SiH_4$ at 45 sccm, $O_2$ at 60 sccm, $N_2$ at 50 sccm, a substrate temperature of 440° C., an atmospheric reaction pressure, and a deposition time of 90 seconds.

Figure 21A:
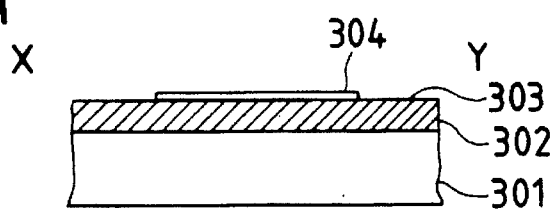
FIGS. 21A and 21B are respectively a cross-sectional view and a plan view, showing the state of formation of the nucleation surface in the first embodiment of the present invention.
Figure 21B:
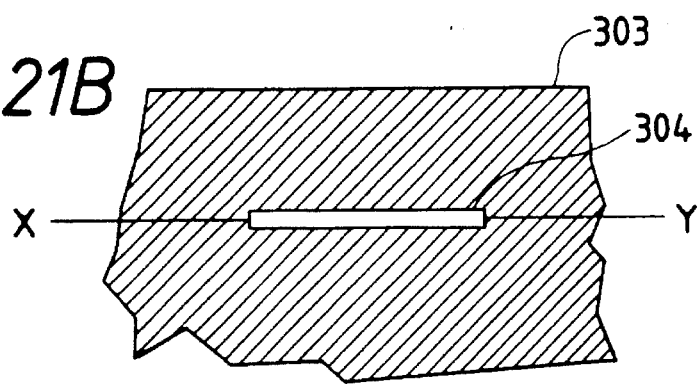
Figure 22A:
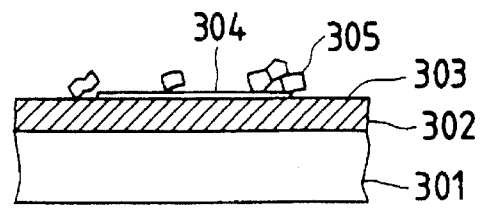
FIGS. 22A and 22B are respectively a cross-sectional view and a plan view, showing the state of GaAs crystal nucleation in the first embodiment of the present invention.
Figure 22B:
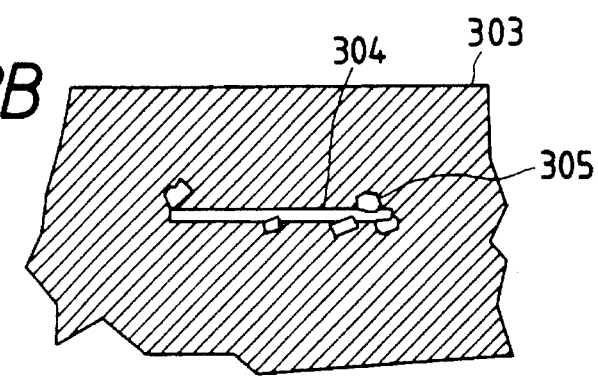

(2nd step)
Then, as shown in FIGS. 21A and 21B, a polysilicon film was deposited by LPCVD with a thickness of 500 Å, and was photolithographically patterned into a fine rectangle with a shorter side of 3 μm and a longer side of 40 μm. Then etching was conducted with liquid etchant of a composition $HF:HNO_3:CH_3COOH=1:60:60$ to form a nucleation surface 304. The mutual distance between thus formed nucleation surfaces 304 was selected as 50 μm. The deposition of the polysilicon film was conducted with $SiH_4$ at 45 sccm, a substrate temperature of 620° C., a pressure of 220 mTorr and a deposition time of 150 seconds.
(3rd step)
The growth of GaAlAs was conducted in the MOCVD apparatus shown in FIG. 19. At first, as shown in FIGS. 22A and 22B, N-GaAs nuclei 305 were generated on the nucleation surface 304, under the following conditions:

| | |
|---|---|
| TMG | $2.4 \times 10^{-5}$ mol/min. |
| $AsH_3$ | $1.8 \times 10^{-3}$ mol/min. |
| $SiH_4$ (dopant) | $9.0 \times 10^{-6}$ mol/min. |
| HCl (etchant) | $1 \times 10^{-5}$ mol/min. |
| $H_2$ (carrier gas) | 10 l/min. |
| Substrate temp. | 775° C. |
| Pressure | 20 Torr. |

Figure 23A:
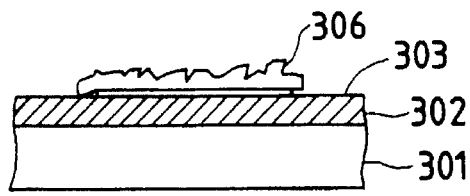
FIGS. 23A and 23B are respectively a cross-sectional view and a plan view, showing the state of formation of a GaAs crystal island in the first embodiment of the present invention.
Figure 23B:
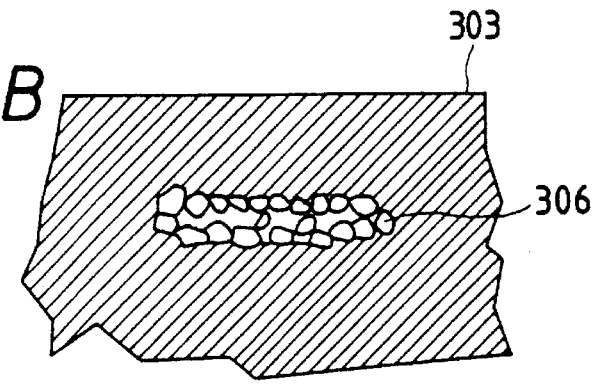
Figure 24A:
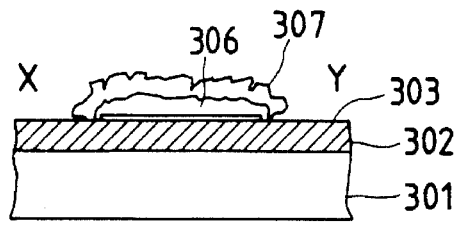
FIGS. 24A, 24C and 24B are respectively cross-sectional views and a plan view, showing the state of formation of an N-GaAlAs polycrystalline layer in the first embodiment of the present invention.
Figure 24B:
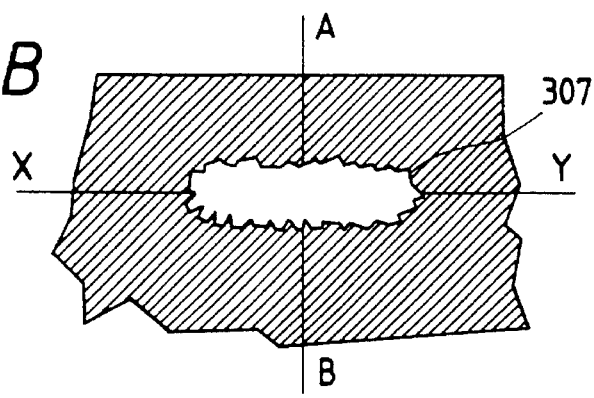
Figure 24C:
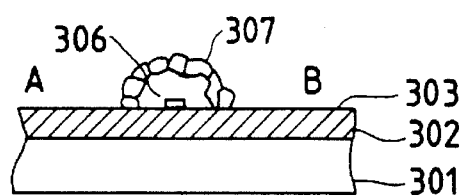

GaAs was generated at first because the selective growth is easier than in GaAlAs so that larger crystal grains can be obtained more easily at the nucleation.
(4th step)
The crystal growth in the 3rd step was continued for 30 minutes until the shorter side of the crystal island 306, consisting of N-GaAs crystals 305 as shown in FIGS. 23A and 23B, reached 15 μm.
(5th step)
Then, TMA was introduced into the raw material gas to grow N-GaAlAs 307 on the crystal island 306, as shown in FIGS. 24A–24C, under the following conditions:

| | |
|---|---|
| TMG | $2.0 \times 10^{-5}$ mol/min. |
| TMA | $4.0 \times 10^{-6}$ mol/min. |
| $AsH_3$ | $1.8 \times 10^{-3}$ mol/min. |
| $SiH_4$ (dopant) | $9.1 \times 10^{-6}$ mol/min. |
| HCl (etchant) | $1 \times 10^{-5}$ mol/min. |
| $H_2$ (carrier gas) | 10 l/min. |
| Substrate temp. | 775° C. |
| Pressure | 20 Torr |

Figure 25A:
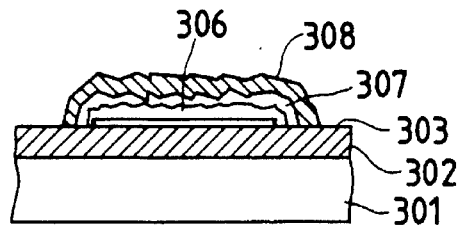
FIGS. 25A and 25B are respectively a cross-sectional view and a plan view, showing the state of formation of a P-GaAlAs polycrystalline layer in the first embodiment of the present invention.
Figure 25B:
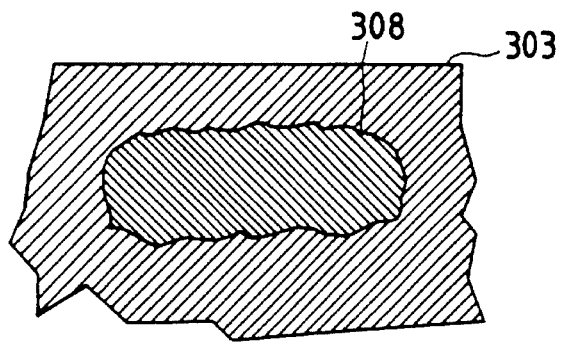
Figure 26A:
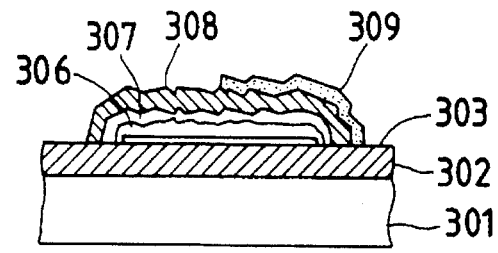
FIGS. 26A and 26B are respectively a cross-sectional view and a plan view, showing the state of formation of a P-electrode in the first embodiment of the present invention.
Figure 26B:
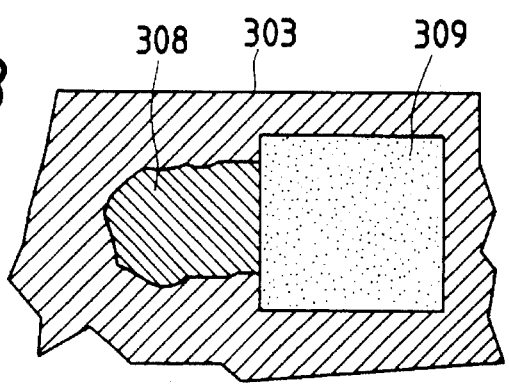
Figure 27A:
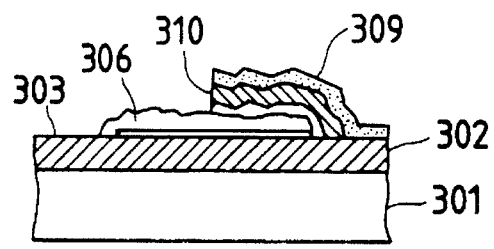
FIGS. 27A and 27B are respectively a cross-sectional view and a plan view, showing the state of etching of the GaAlAs layer in the first embodiment of the present invention.
Figure 27B:
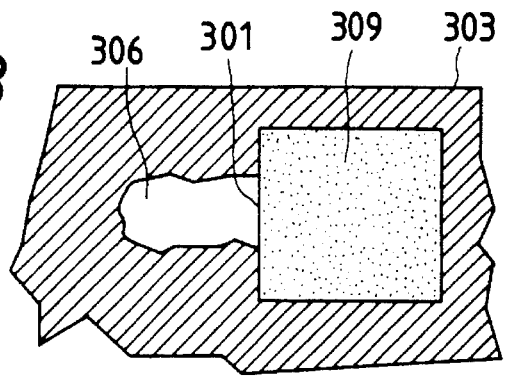

The growth was conducted for 15 minutes, until the shorter side of the crystal island reached 20 μm by the growth of GaAlAs 307.
(6th step)
Then the dopant was switched from $SiH_4$ to DEZ to grow P-GaAlAs 308 as shown in FIGS. 25A and 25B, under the same conditions as in the 5th step, except that $SiH_4$ was replaced by DEZ at a flow rate of $1 \times 10^{-5}$ mol/min. The growth was conducted for 15 minutes until the shorter side of the crystal island reached 23 μm.
(7th step)
A photoresist pattern was formed except an area in which the P-electrode was to be formed, and a Cr/Au film was formed by evaporation as shown in FIGS. 26A and 26B. A chromium film of a thickness of 500 Å and a gold film of a thickness of 5000 Å were deposited in continuation by evaporation with resistance heating, and a P-electrode 309 was formed by the lift-off process.
(8th step)
Etching was conducted, utilizing the P-electrode 309 as a mask, until the N-GaAs layer 305 of the crystal island 306 was exposed, as shown in FIGS. 27A and 27B, whereby a section 310 was formed in the GaAlAs layer 307, serving as the light-emitting part in the LED. Said etching was conducted by immersion, for 15 seconds, in a mixture of $CH_3COOH$, $H_2O_2$, $H_2SO_4$ and $H_2O$.
(9th step)

Figure 28A:
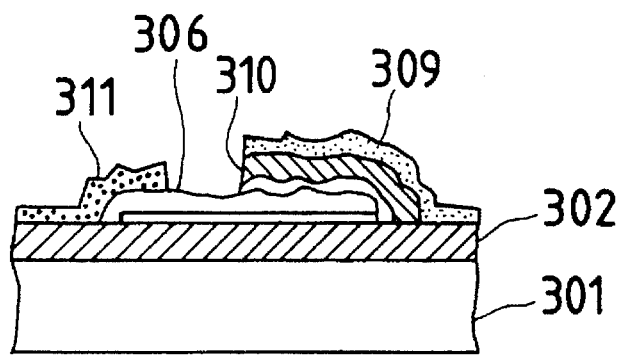
FIGS. 28A and 28B are respectively a cross-sectional view and a plan view, showing the state of formation of an N-electrode in the first embodiment of the present invention.
Figure 28B:
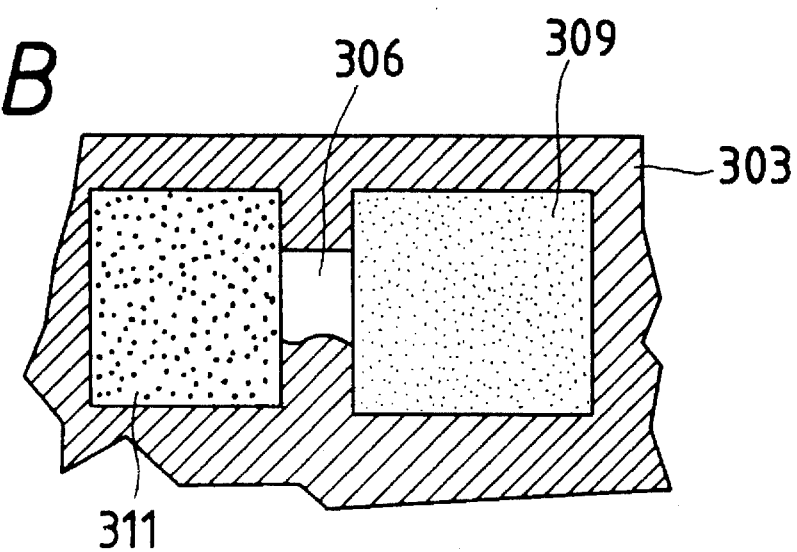

A photoresist pattern was formed except an area for the N-electrode, and an AuGe/Au film was formed by evaporation. An AuGe alloy film of a thickness of 2000 Å and an Au film of a thickness of 5000 Å were deposited in continuation by evaporation with resistance heating, and an N-electrode 311 was formed by the lift-off process, as shown in FIGS. 28A and 28B. After completion of the process, the device was heat treated for 10 minutes at 420° C., in argon atmosphere. The production yield of the devices (defects being short-circuiting and connection breakage) was 93% for the conventional devices (with nucleation surface 3×3 μm) produced in the same process, and 97% for the devices of the present invention (nucleation surface 3×40 μm).

Figure 29A:
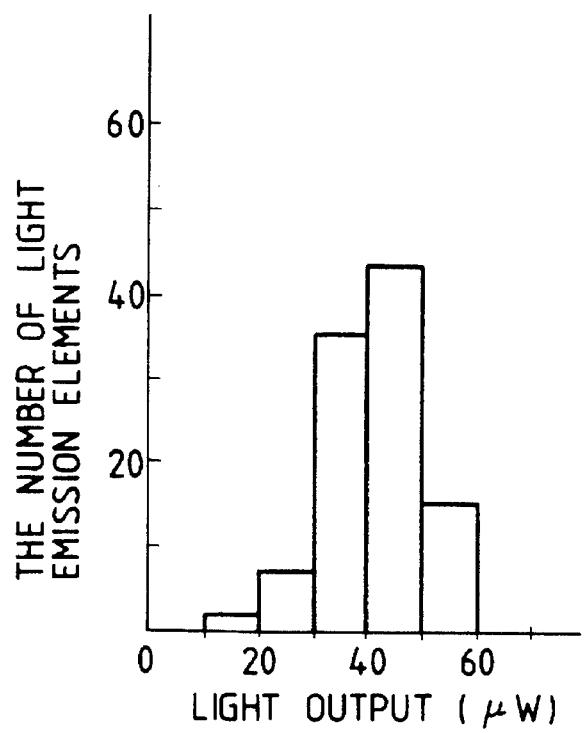
FIGS. 29A and 29B are charts showing the fluctuation in the light output, respectively in a device of a first embodiment of the present invention and in a conventional device.
Figure 29B:
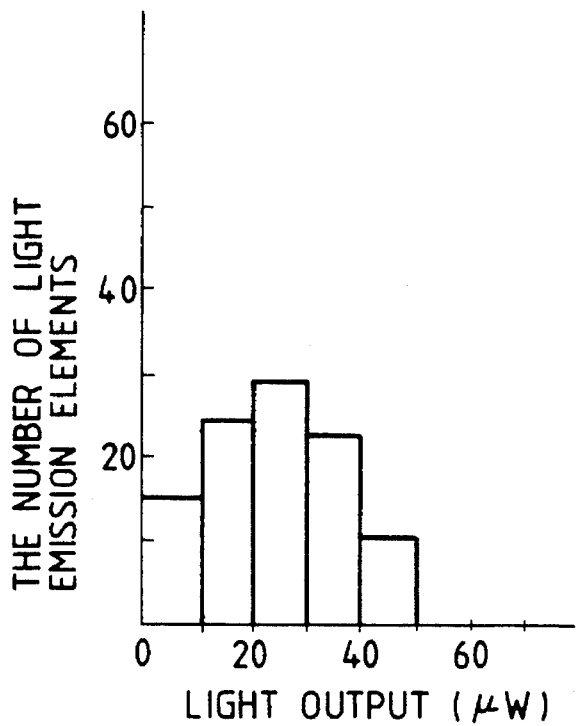

FIGS. 29A and 29B show the fluctuation of the light output, respectively in the devices of the present invention (nucleation surface 3×40 μm) and the conventional devices (nucleation surface 3×3 μm). Said light output is shown in a saturated state attained by increase in current. In the devices of the present invention, the light output is within a range of 30–50 μW in about 90% of the devices. On the other hand, in the conventional devices, the light output is widely dispersed.

EXAMPLE 2

FIGS. 30A to 40B illustrates, cross-sectional views and plan views in pairs, the steps for forming an LED device of double heterogeneous structure, employing $Ga_{0.75}Al_{0.25}As$/$Ga_{0.5}Al_{0.5}As$ polycrystals of the present invention.
(1st step)

Figure 30A:
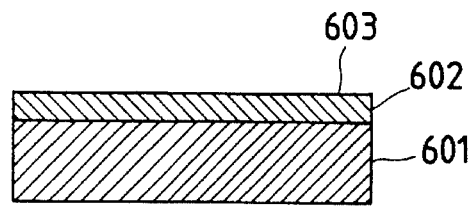
FIGS. 30A and 30B are'respectively a cross-sectional view and a plan view, showing the state of deposition of a non-nucleation surface in the second embodiment of the present invention.
Figure 30B:
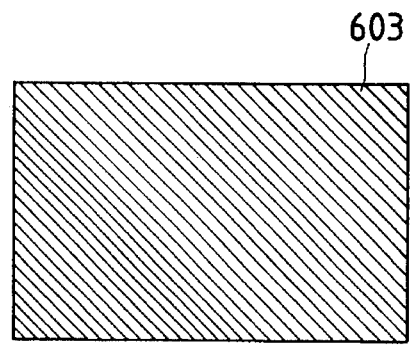

On a polysilicon substrate 601 of a thickness of 0.5 mm, there was deposited, as shown in FIGS. 30A and 30B, a $SiO_2$ film 602 of a thickness of 1500 Å by CVD employing $SiH_4$ and $O_2$. The upper face of said $SiO_2$ film 602 formed the non-nucleation surface 603.

The deposition was conducted with $SiH_4$ at 45 sccm, $O_2$ at 60 sccm, $N_2$ at 50 sccm, a substrate temperature of 400° C., an atmospheric reaction pressure, and a deposition time of 90 seconds.
(2nd step)

Figure 31A:
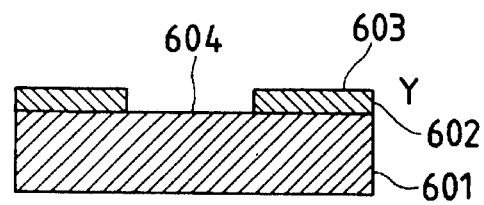
FIGS. 31A and 31B are respectively a cross-sectional view and a plan view, showing the state of formation of the non-nucleation surface in the second embodiment of the present invention.
Figure 31B:
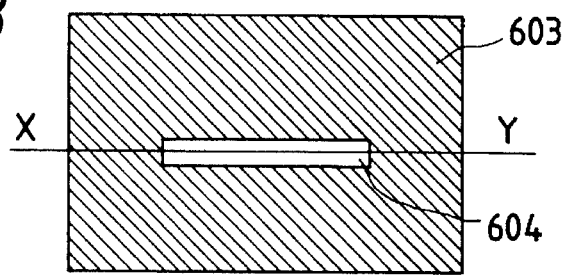
Figure 32A:
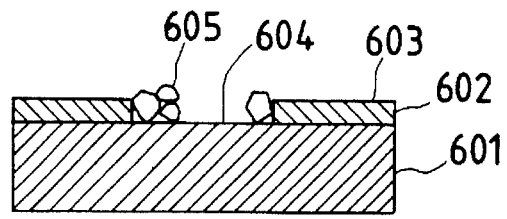
FIGS. 32A and 32B are respectively a cross-sectional view and a plan view, showing the state of GaAs crystal nucleation in the second embodiment of the present invention.
Figure 32B:
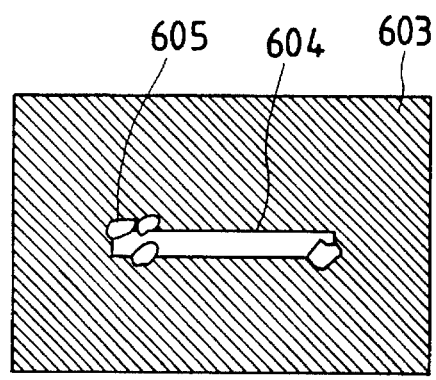

Then the non-nucleation surface 603 was photolithographically patterned into a fine rectangle with a shorter side of 2.5 μm and a longer side of 50 μm, and the $SiO_2$ film was etched with liquid etchant consisting of $HF:H_2O=1:40$ to expose the nucleation surface 604 as shown in FIGS. 31A and 31B. The mutual distance between the nucleation surfaces 604 was selected as 50 μm.
(3rd step)

The semiconductor layers were grown with the MOCVD apparatus shown in FIG. 19.

At first, N-GaAs nuclei 605 were generated on the nucleation surface 604 under the following conditions:

| TMG | $2.4 \times 10^{-5}$ mol/min. |
|---|---|
| $AsH_3$ | $1.8 \times 10^{-3}$ mol/min. |
| $SiH_4$ (dopant) | $9.1 \times 10^{-6}$ mol/min. |
| HCl (etchant) | $1 \times 10^{-5}$ mol/min. |
| $H_2$ (carrier gas) | 10 l/min. |
| Substrate temp. | 775° C. |
| Pressure | 20 Torr. |

GaAs was generated at first because the selective growth is easier than in GaAlAs so that larger crystal grains can be obtained more easily at the nucleation. Also ohmic junction is easier to obtain.
(4th step)

Figure 33A:
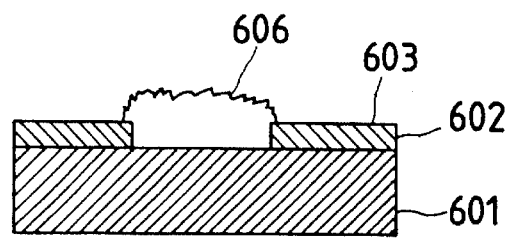
FIGS. 33A and 33B are respectively a cross-sectional view and a plan view showing the state of formation of a GaAs crystal island in the second embodiment of the present invention.
Figure 33B:
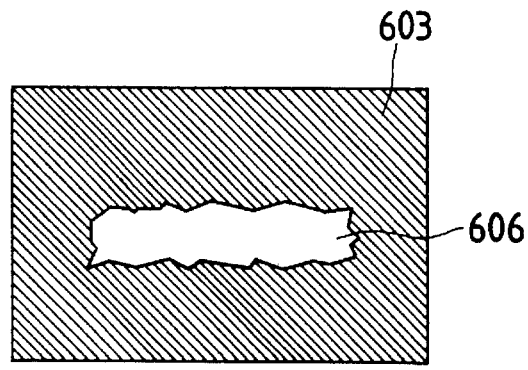

The crystal growth in the 3rd step was continued for 30 minutes until the shorter side of the crystal island 606, consisting of N-GaAs crystals 605 as shown in FIGS. 33A and 33B, reached 15 μm.
(5th step)

Figure 34A:
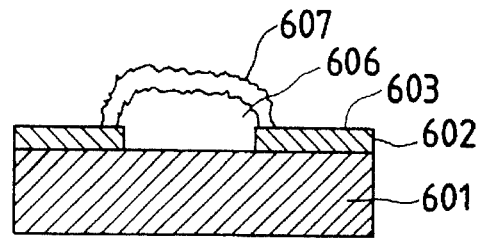
FIGS. 34A and 34B are respectively a cross-sectional view and a plan view, showing the state of formation of an N-GaAlAs polycrystalline layer in the second embodiment of the present invention.
Figure 34B:
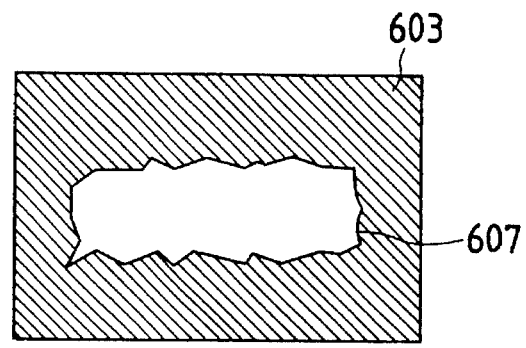

Then, TMA was introduced into the raw material gas to grow $N-Ga_{0.5}Al_{0.5}As$ 607 on the crystal island 606, as shown in FIGS. 34A and 34B, under the following conditions:

| TMG | $1.2 \times 10^{-5}$ mol/min. |
|---|---|
| TMA | $1.2 \times 10^{-5}$ mol/min. |
| $AsH_3$ | $1.8 \times 10^{-3}$ mol/min. |
| $SiH_4$ (dopant) | $9.1 \times 10^{-6}$ mol/min. |
| HCl (etchant) | $1 \times 10^{-5}$ mol/min. |
| $H_2$ (carrier gas) | 10 l/min. |
| Substrate temp. | 775° C. |
| Pressure | 20 Torr |

The growth was conducted for 15 minutes, until the shorter side of the crystal island reached 20 μm by the growth of $Ga_{0.5}Al_{0.5}As$ 607.
(6th step)

Figure 35A:
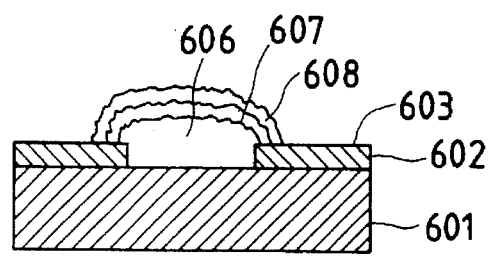
FIGS. 35A and 35B are respectively a cross-sectional view and a plan view, showing the state of formation of a neutral GaAlAs polycrystalline layer in the second embodiment of the present invention.
Figure 35B:
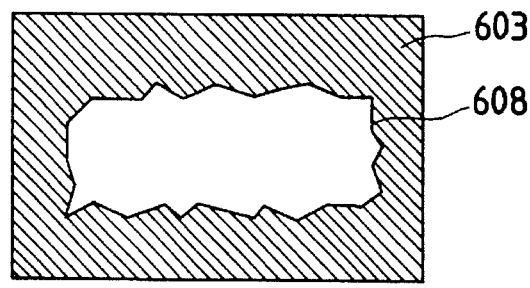

Then the doping gas was discontinued to deposit a neutral $Ga_{0.75}Al_{0.25}As$ layer 608, as shown in FIGS. 35A and 35B, under the following conditions:

| TMG | $1.8 \times 10^{-5}$ mol/min. |
|---|---|
| TMA | $6.0 \times 10^{-6}$ mol/min. |
| $AsH_3$ | $1.8 \times 10^{-3}$ mol/min. |
| HCl (etchant) | $1 \times 10^{-5}$ mol/min. |
| $H_2$ (carrier gas) | 10 l/min. |
| Substrate temp. | 775° C. |
| Pressure | 20 Torr |

The growth was conducted for 10 minutes, until the shorter side of the crystal island reached 22 μm by the growth of $Ga_{0.75}Al_{0.25}As$ 608.
(7th step)

Figure 36A:
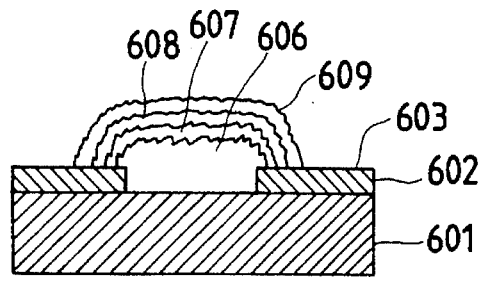
FIGS. 36A and 36B are respectively a cross-sectional view and a plan view, showing the state of formation of a P-GaAlAs polycrystalline layer in the second embodiment of the present invention.
Figure 36B:
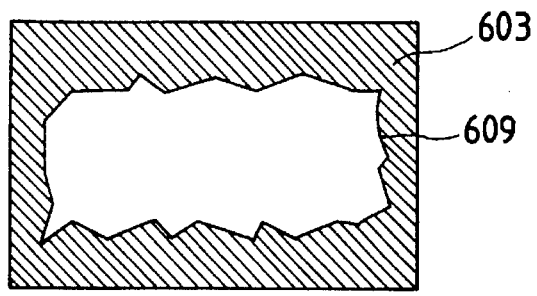

Then the dopant was switched to DEZ to grow $P-Ga_{0.5}Al_{0.5}As$ 609 as shown in FIGS. 36A and 36B, under the same conditions as in the 5th step, except that $SiH_4$ was replaced by DEZ at a flow rate of $1\times10^{-5}$ mol/min. The growth was conducted for 15 minutes, until the shorter side of the crystal island reached 24 μm by the growth of $P-Ga_{0.5}Al_{0.5}As$ 609.
(8th step)

Figure 37A:
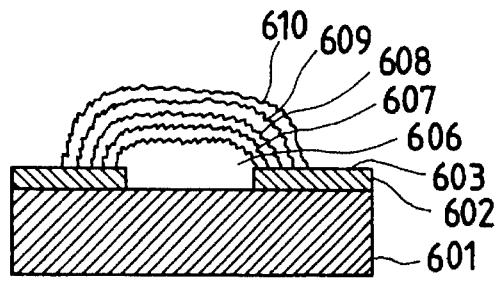
FIGS. 37A and 37B are respectively a cross-sectional view and a plan view, showing the state of formation of a P-GaAs polycrystalline layer in the second embodiment of the present invention.
Figure 37B:
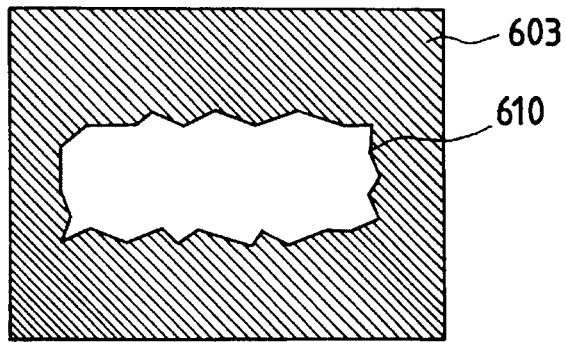

Then, as shown in FIGS. 37A and 37B, P-GaAs 610 was deposited for forming ohmic junction, under the same conditions as in the 3rd step, except that $SiH_4$ was replaced by DEZ at a flow rate of $1\times10^{-5}$ mol/min. The growth was conducted for 1 minute.
(9th step)

Figure 38A:
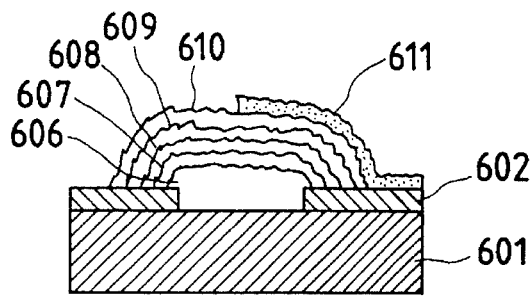
FIGS. 38A and 38B are respectively a cross-sectional view and a plan view, showing the state of formation of a P-electrode in the second embodiment of the present invention.
Figure 38B:
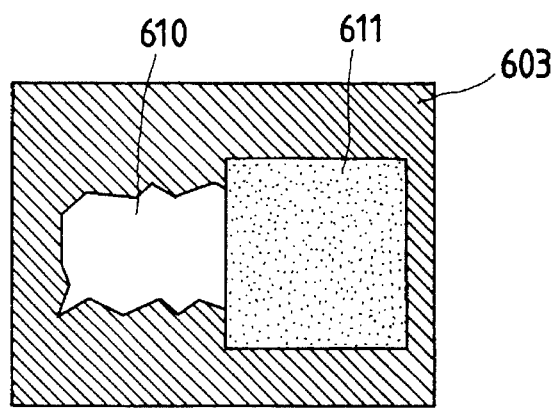

A photoresist pattern was formed on the P-GaAs layer 610, except an area for the P-electrode, and a Cr/Au film was formed by evaporation. A Cr film of a thickness of 500 Å and an Au film of a thickness of 5000 Å were deposited in continuation by evaporation with resistance heating, and a P-electrode 611 was formed by the lift-off method, as shown in FIGS. 38A and 38B.
(10th step)

Figure 39A:
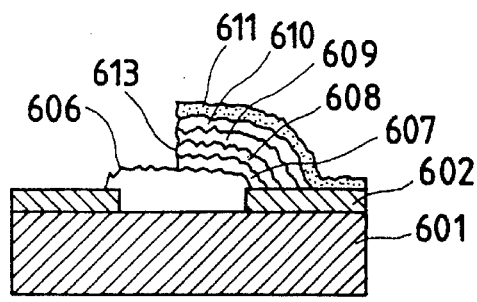
FIGS. 39A and 39B are respectively a cross-sectional view and a plan view, showing the state of etching of the polycrystalline layer in the second embodiment of the present invention.
Figure 39B:
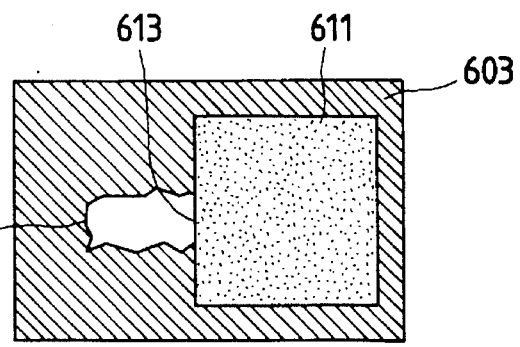

Etching was conducted, utilizing the P-electrode 611 as a mask, until the N-GaAs layer 605 of the crystal island 606 was exposed, as shown in FIGS. 39A and 39B. Said etching was conducted by immersion, for 17 seconds, in a mixture of $CH_3COOH$, $H_2O_2$, $H_2SO_4$ and $H_2O$. Said etching formed, in the semiconductor layers, a section 613 which serves as the light-emitting part in the LED.

(11th step)

Figure 40A:
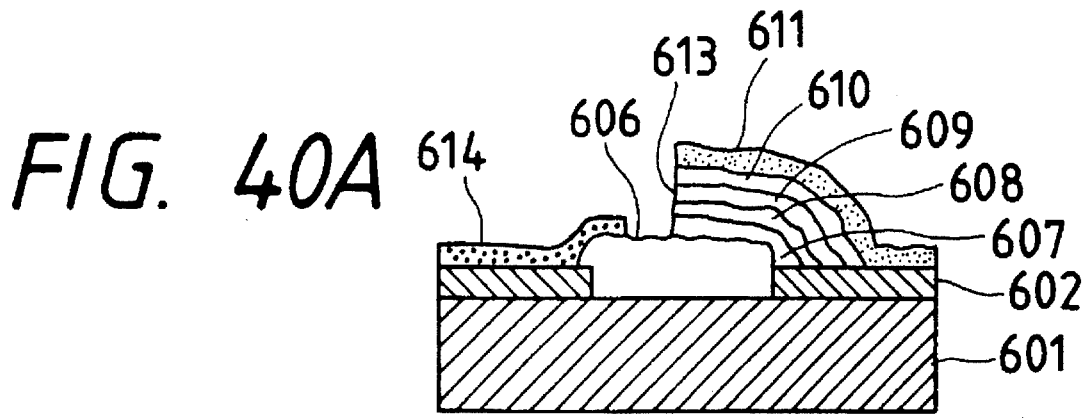
FIGS. 40A and 40B are respectively a cross-sectional view and a plan view, showing the state of formation of an N-electrode in the second embodiment of the present invention.
Figure 40B:
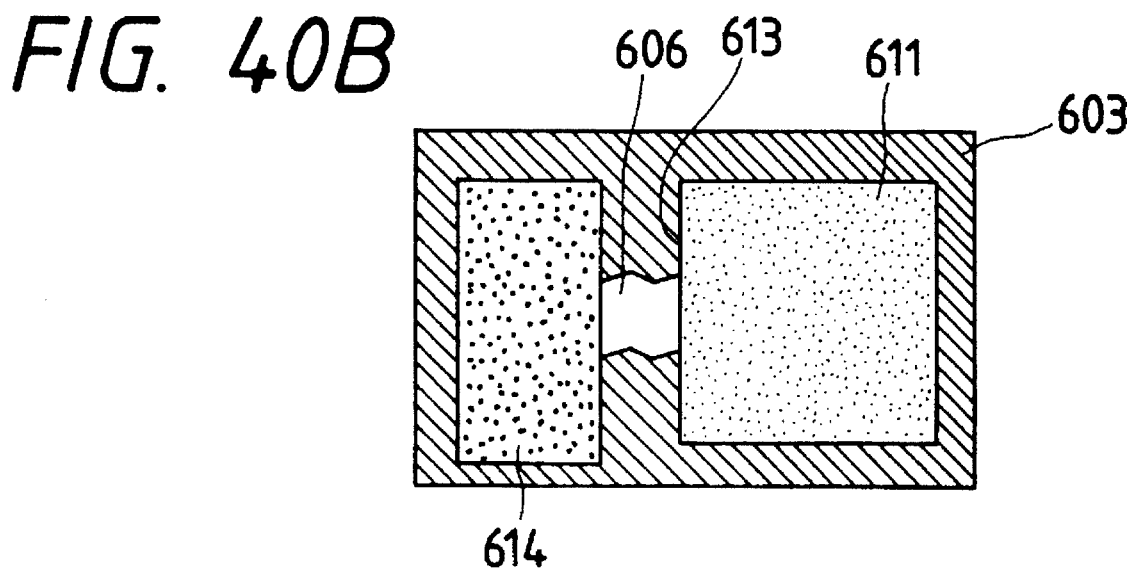

A photoresist pattern was formed except an area for the N-electrode, and an AuGe/Au film was formed by evaporation. An AuGe alloy film of a thickness of 2000 Å and an Au film with a thickness of 5000 Å were deposited in continuation by evaporation with resistance heating, and an N-electrode 614 as shown in FIGS. 40A and 40B was formed by the lift-off process. After completion of the process, the device was heat treated for 10 minutes at 420° C., in argon atmosphere. The production yield of the devices (defects being short-circuiting and connection breakage) was 90% for the conventional devices (with nucleation surface of 2.5×2.5 μm) produced in the same process, and 96% for the devices of the present invention (with nucleation surface of 2.5×50 μm). The light emission wavelength region was 720–730 nm.

Figure 41A:
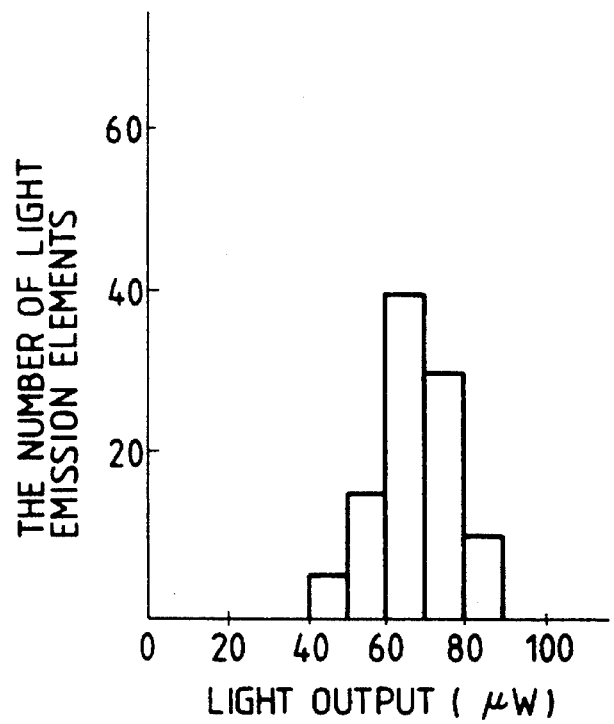
FIGS. 41A and 41B are charts showing fluctuation in the light output, respectively in a device of the second embodiment of the present invention and in a conventional device.
Figure 41B:
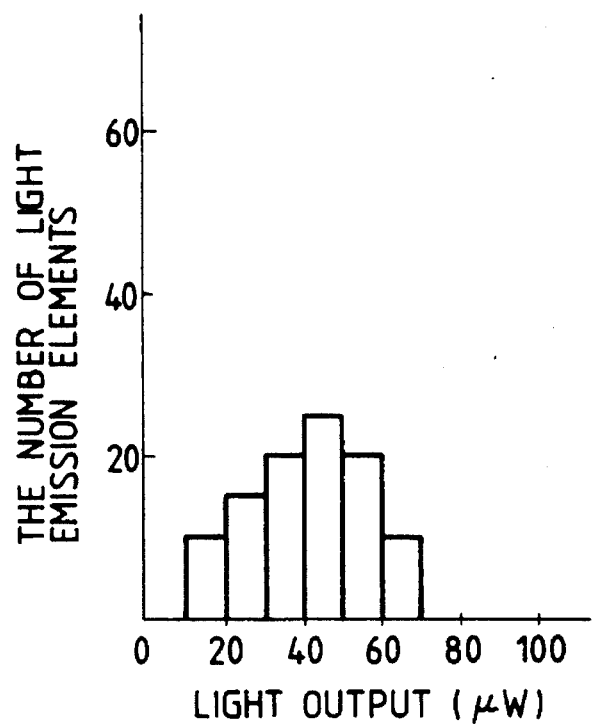

FIGS. 41A and 41B show the fluctuation of the light output, respectively in the devices of the present invention (with nucleation surface of 2.5×50 μm) and the conventional devices (with nucleation surface of 2.5×2.5 μm). Said light output is shown in a saturated state attained by increase in current. In the devices of the present invention, the light output is within a range of 60–80 μW in about 70% of the devices. On the other hand, in the conventional devices, the light output is widely dispersed.

In the foregoing embodiments, III-V compound semiconductors have been selected for crystal growth, but such compounds are not limitative. For example II-VI compounds may be employed as long as light emission is possible by an LED structure.

Figure 42:
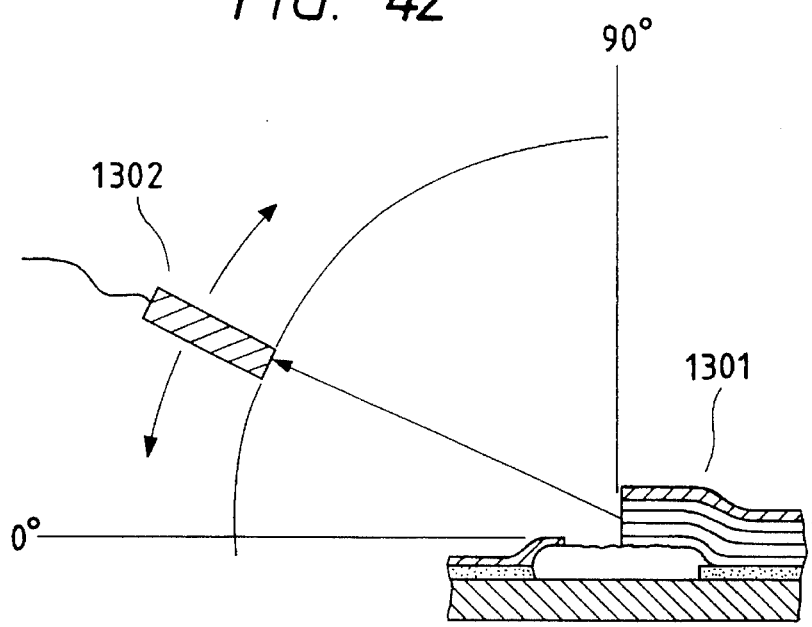
FIG. 42 is a schematic view of a system for measuring the light irradiation angle of the LED device of the present invention.

The LED device produced in the above-explained process was subjected to the measurement of light irradiation angle, in an optical measuring system shown in FIG. 42. A highly directional photosensor 1302 including a lens system was positioned on the extension of the longer side of the rectangular nucleation surface of the LED 1301, and the angular dependence of the light emission intensity was measured by moving said photosensor along a circle around the light-emitting part of the LED.

Figure 43:
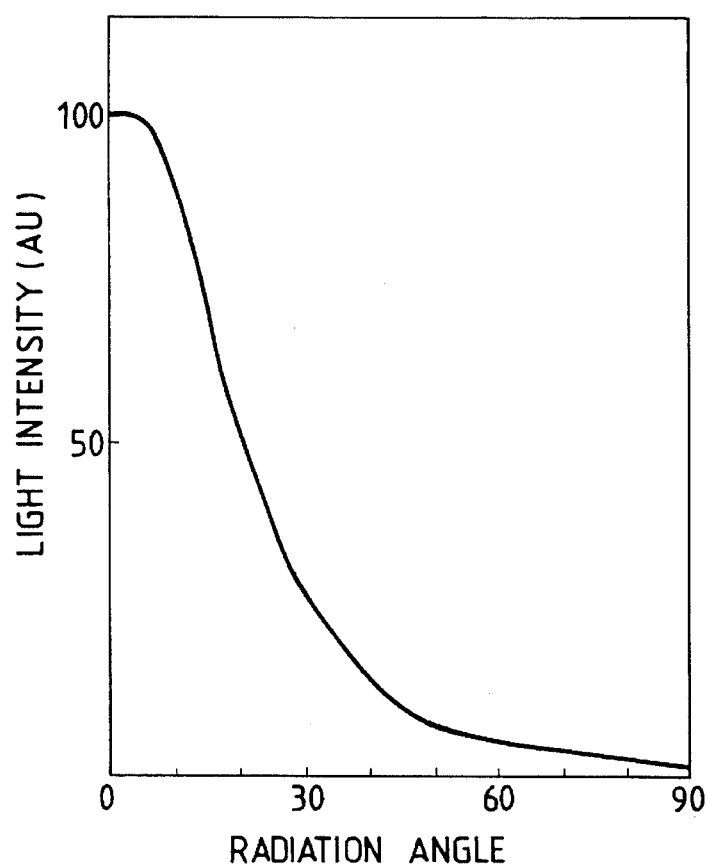
FIG. 43 is a chart showing the angle dependence of intensity of the light emitted by the LED device of the present invention.

FIG. 43 shows the distribution of the light emission intensity, taking the extension of the longer side of the nucleation surface at 0°. As shown in FIG. 43, about 70% of the emitted light is concentrated within a range from 0° to 20°.

EXAMPLE 3

Figure 44:
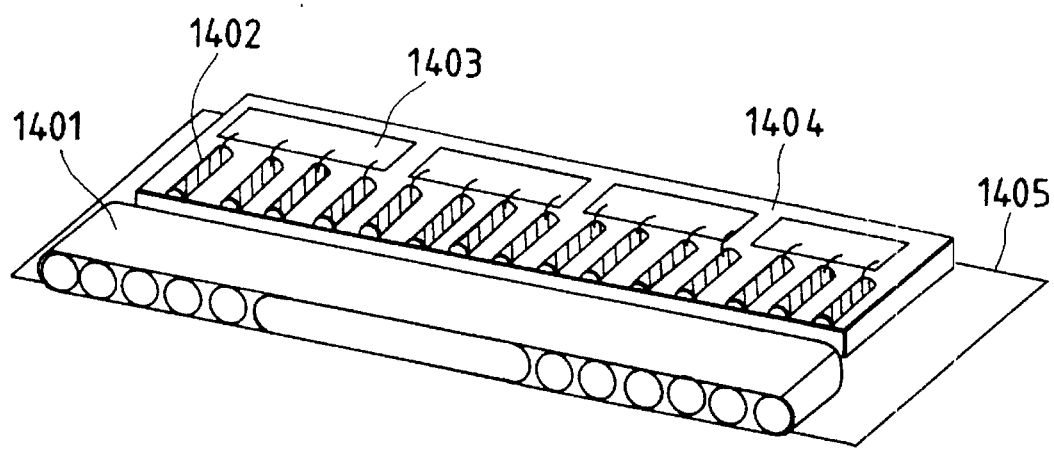
FIG. 44 is a schematic view of an LED printer head employing the LED devices of the present invention.

1000 LED's prepared in the foregoing examples were arranged with a pitch of 80 μm to form an LED array, and an optical recording head as shown in FIG. 44, for a printer, was prepared with said LED array. On a substrate 1404, there were mounted LED's 1402 and driving IC's 1403 by wire bonding, and said substrate 1404 and a Selfoc lens 1401 were mounted on a support 1405. Said Selfoc lens 1401 was mounted in such a manner that each lens is positioned on the extension of the longer side of the rectangular nucleation surface of the LED 1402.

Figure 45:
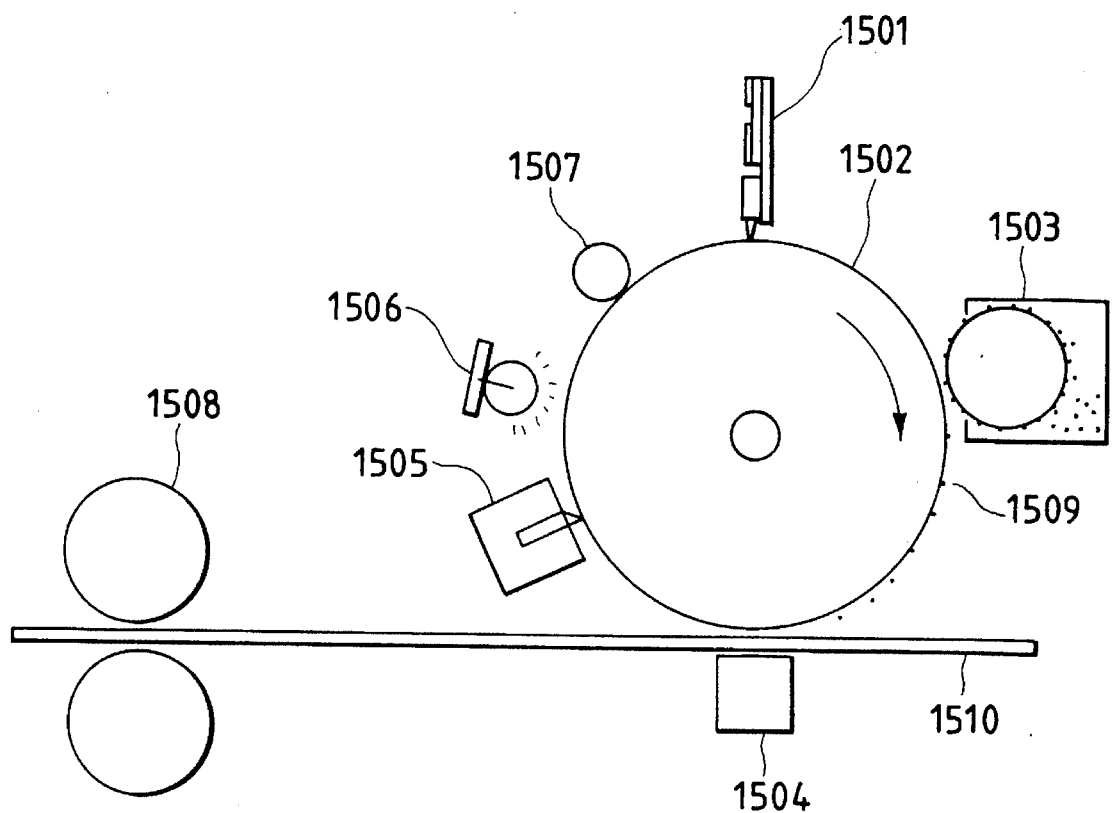
FIG. 45 is a schematic view of an electrophotographic system utilizing the LED head shown in FIG. 44.

The LED printer head thus prepared was incorporated in an electrophotographing printer system as shown in FIG. 45.

In said system, around a photosensitive drum 1502, there were provided the LED printer head 1501, a developing unit 1503, a transfer unit 1504, a cleaner unit 1505, a pre-exposure lamp 1506 and a charging roller 1507 arranged in this order.

On the surface of the photosensitive drum 1502, which is erased by the pre-exposure lamp 1506 and changed by the charging roller 1507, a latent image is formed by the LED printer head 1501. Said latent image is subjected to the deposition of toner 1509 from the developing unit 1503. The toner 1509 deposited on the latent image on the surface of the photosensitive drum 1502 is transferred onto a paper 1510 advanced between the photosensitive drum 1502 and the transfer unit 1504, and is fixed to said paper 1510 by heating in the fixing unit 1508 positioned in the downstream side in the advancing direction of the paper 1510. The surface of the photosensitive drum 1502 is subjected to the removal of unnecessary toner 1509 by the cleaner unit 1505, and is again erased by the pre-exposure lamp 1506, and the above-explained printing operation is thereafter repeated.

An image corresponding to the printing electrical signal was formed on the paper 1510, and it was thus confirmed that the LED's of the present invention could function as an optical recording head.

Because of the above-explained configuration, the present invention provides following advantages.

A configuration in the present invention provides the advantages of stabilizing the light-emitting area and the light emission intensity, and preventing the loss in production yield, resulting from short-circuiting and contact breakage.

A configuration in another aspect of the present invention provides, in addition, the advantages of effectively taking out the emitted light, and facilitating the device formation.

Configurations in further specific aspect of the present invention enhance the advantages mentioned above.

Configurations in the specific embodiment of the present invention provides the advantage of realizing an optical recording head and an optical printer having the above-mentioned advantages.

What is claimed is:

1. A light-emitting device formed by applying a crystal formation process to a substrate with a free surface on which are provided, in mutually adjacent manner, a non-nucleation surface and a nucleation surface with a nucleation density larger than that of said non-nucleation surface, wherein said nucleation surface is formed into an elongated configuration of a width of 1–8 μm, comprising a first polycrystalline semiconductor layer of a first conductive type formed on said nucleation surface, a second polycrystalline semiconductor layer of a second conductive type which is opposite of said first conductive type formed on said first polycrystalline semiconductor layer so as to expose a portion of said first polycrystalline semiconductor layer, and a plurality of electrodes respectively formed on said exposed portion of said first polycrystalline layer and said second polycrystalline second layer.

2. A light-emitting device according to claim 1, wherein a size of the nucleation surface is to selected that an average grain size of the crystals formed on the substrate is 0.6 μm or larger.

3. A light-emitting device according to claim 1, wherein said nucleation surface has a longer side of 8 μm or longer.

4. A light emitting device according to claim 1, wherein a plurality of said nucleation surfaces are provided.

5. A light emitting device according to claim 1, wherein, in the crystal formation process, an etchant material is added.

6. A light emitting device according to claim 1, wherein said substrate is made of at least one of the following: $Al_2O_3$, Al, BN ceramic, carbon, polysilicon, quartz, high melting point glass, W, Mo and Ti.

7. A light emitting device according to claim 1, wherein said non-nucleation surface is formed of at least one of amorphous $SiO_2$ and amorphous $Si_3N_4$.

8. A light emitting device according to claim 1, wherein said nucleation surface is formed of at least one of the following: non-monocrystalline silicon, AlN, $Al_2O_3$, $TaO_5$, TiN, $TiO_2$ and $WO_3$.

9. A light emitting device according to claim 1, wherein said plurality of electrodes are at least one of Cr/Au or AuGe/Au.

10. A light-emitting device according to claim 1, wherein crystals formed on the substrate are polycrystals of a compound of groups III and V of the periodic table.

11. A light emitting device according to claim 10, wherein said group III-V compound is at least one of the following: GaAs, GaAlAs, GaP, GaAsP, InP and GaInAsP.

12. A optical recording printer head utilizing a light-emitting device formed by applying a crystal formation process to a substrate with a free surface on which are provided, in mutually adjacent manner, a non-nucleation surface and a nucleation surface with a nucleation density larger than that of said non-nucleation surface, wherein said nucleation surface is formed into an elongated configuration of a width of 1–8 μm, said light-emitting device comprising a first polycrystalline semiconductor layer of a first conductive type formed on said nucleation surface, a second polycrystalline semiconductor layer of a second conductive type which is opposite of said first conductive type formed on said first polycrystalline semiconductor layer so as to expose a portion of said first polycrystalline semiconductor layer, and a plurality of electrodes respectively formed on said exposed portion of said first polycrystalline layer and said second polycrystalline semiconductor layer.

13. A light emitting device according to claim 12, wherein a plurality of said nucleation surfaces are formed with intervals of 10–200 μm therebetween.

14. An optical printer apparatus utilizing an optical recording printer head having a light emitting device formed by applying a crystal formation process to a substrate with a free surface on which are provided, in mutually adjacent manner, a non-nucleation surface and a nucleation surface with a nucleation density larger than that of said non-nucleation surface, wherein said nucleation surface is formed into an elongated configuration of a width of 1–8 μm, said light-emitting device comprising a first polycrystalline semiconductor layer of a first conductive type formed on said nucleation surface, a second polycrystalline semiconductor layer of a second conductive type which is opposite of said first conductive type formed on said first polycrystalline semiconductor layer so as to expose a portion of said first polycrystalline semiconductor layer, and a plurality of electrodes respectively formed on said exposed portion of said first polycrystalline layer and said second polycrystalline second layer.

* * * * *

UNITED STATES PATENT AND TRADEMARK OFFICE
CERTIFICATE OF CORRECTION

PATENT NO. : 5,548,131

DATED : August 20, 1996

INVENTOR(S): HIROYUKI TOKUNAGA ET AL.

It is certified that error appears in the above-identified patent and that said Letters Patent is hereby corrected as shown below:

ON TITLE PAGE AT [56] REFERENCES CITED

FOREIGN PATENT DOCUMENTS
Insert --285358 3/1988 European Pat. Off.--
Insert --284433 9/1988 European Pat. Off.
       484922 5/1992 European Pat. Off.--

OTHER PUBLICATIONS
 Insert --"Selective Growth Of GaAs" by B.K. Bischoff,
  J.J. Cuomo; IBM Technical Disclosure Bulletin; Vol. 16,
  No. 9 February 1974, New York US page 3072--

Insert --"Selective deposition of diamond crystals by
  chemical vapor deposition using a tungsten-filament
  method" by K. Kirabayashi & Y. Taniguchi; Applied Physics
  Letters; Vol. 53, No. 19 7 November 1988, N.Y. USA pgs.
  1815-1817--

COLUMN 3
 Line 52, "state" should read --state of--.

COLUMN 4
 Line 14, "later" should read --layer--.

UNITED STATES PATENT AND TRADEMARK OFFICE
CERTIFICATE OF CORRECTION

PATENT NO. : 5,548,131

DATED : August 20, 1996

INVENTOR(S): HIROYUKI TOKUNAGA ET AL.   Page 2 of 3

It is certified that error appears in the above-identified patent and that said Letters Patent is hereby corrected as shown below:

COLUMN 8
Line 50, "O. Paz" should read --O. Paz--.

COLUMN 9
Line 62, "(triehtyl" should read --(triethyl--.

COLUMN 10
Line 8, "moler" should read --molar--.

COLUMN 11
Line 30, "reactor 2091" should read --reactor 209--.

COLUMN 13
Line 32, "illustrates," should read --illustrate,--.
Line 43, "400°" should read --440°--.

COLUMN 16
Line 54, "second" should read --semiconductor--.

COLUMN 17, line 19,
"A" should read --An--.

UNITED STATES PATENT AND TRADEMARK OFFICE
CERTIFICATE OF CORRECTION

PATENT NO. : 5,548,131

DATED : August 20, 1996

INVENTOR(S) : HIROYUKI TOKUNAGA ET AL.   Page 3 of 3

It is certified that error appears in the above-identified patent and that said Letters Patent is hereby corrected as shown below:

COLUMN 18
Line 27, "second" should read --semiconductor--.

Signed and Sealed this

Twenty-ninth Day of April, 1997

BRUCE LEHMAN

Attest:

Attesting Officer

Commissioner of Patents and Trademarks